(12) United States Patent
Sameshima et al.

(10) Patent No.: US 11,171,004 B2
(45) Date of Patent: Nov. 9, 2021

(54) FILM FORMING METHOD AND SUBSTRATE PROCESSING SYSTEM

(71) Applicant: TOKYO ELECTRON LIMITED, Tokyo (JP)

(72) Inventors: Takashi Sameshima, Nirasaki (JP); Koji Maekawa, Nirasaki (JP); Katsumasa Yamaguchi, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 33 days.

(21) Appl. No.: 16/575,694

(22) Filed: Sep. 19, 2019

(65) Prior Publication Data

US 2020/0098573 A1  Mar. 26, 2020

(30) Foreign Application Priority Data

Sep. 20, 2018 (JP) .............................. JP2018-176324
Jun. 18, 2019 (JP) .............................. JP2019-113063

(51) Int. Cl.
  *H01L 21/285* (2006.01)
  *H01L 21/02* (2006.01)
  *H01L 21/67* (2006.01)

(52) U.S. Cl.
  CPC .. *H01L 21/28556* (2013.01); *H01L 21/02631* (2013.01); *H01L 21/6723* (2013.01)

(58) Field of Classification Search
  CPC ........... H01L 21/28556; H01L 21/6723; H01L 21/02631; H01L 21/68742; H01L 21/68764; H01L 21/28562; C23C 16/0272; C23C 16/52; C23C 16/54; C23C 16/45531; C23C 16/303; C23C 16/34; C23C 16/14; C23C 16/45565
  See application file for complete search history.

(56) References Cited

U.S. PATENT DOCUMENTS 6,270,619 B1 * 8/2001 Suzuki ............. H01L 21/67161
                                              118/719
2005/0009325 A1    1/2005 Chung et al.
2016/0351402 A1 * 12/2016 Suzuki ................ C23C 16/0281

FOREIGN PATENT DOCUMENTS

| CN | 102197459 A | 9/2011 |
| CN | 112292476 A | 1/2021 |
| JP | 2013-213274 A | 10/2013 |
| KR | 10-0557964 B1 | 2/2006 |
| KR | 10-2008-0101745 A | 11/2008 |
| WO | 2018/021014 A1 | 2/2018 |

* cited by examiner

*Primary Examiner* — Kyoung Lee
(74) *Attorney, Agent, or Firm* — Nath, Goldberg & Meyer; Jerald L. Meyer; Tanya E. Harkins

(57) ABSTRACT

There is provided a film forming method including: forming an Al-containing film on a base in a depressurized state; and subsequently, forming an initial tungsten film on the Al-containing film by alternately supplying a $B_2H_6$ gas and a $WF_6$ gas in a repetitive manner in the depressurized state without exposing the Al-containing film to an atmosphere while performing a purge process between the supply of the $B_2H_6$ gas and the supply of the $WF_6$ gas.

11 Claims, 14 Drawing Sheets

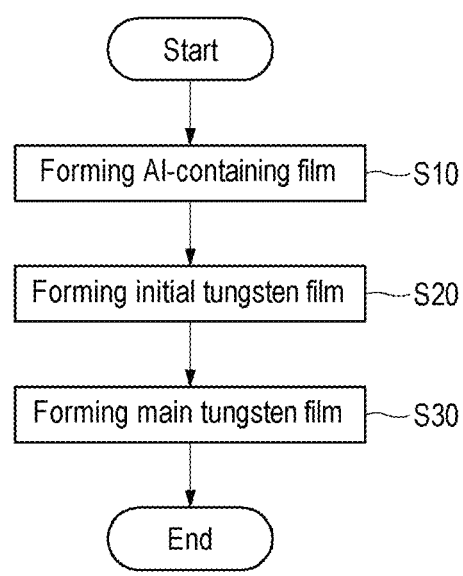

FIG. 10

|  | Sample A | Sample B | Sample C | Sample D |
|---|---|---|---|---|
| Film Peeling | Absence | Presence | Presence | Presence |

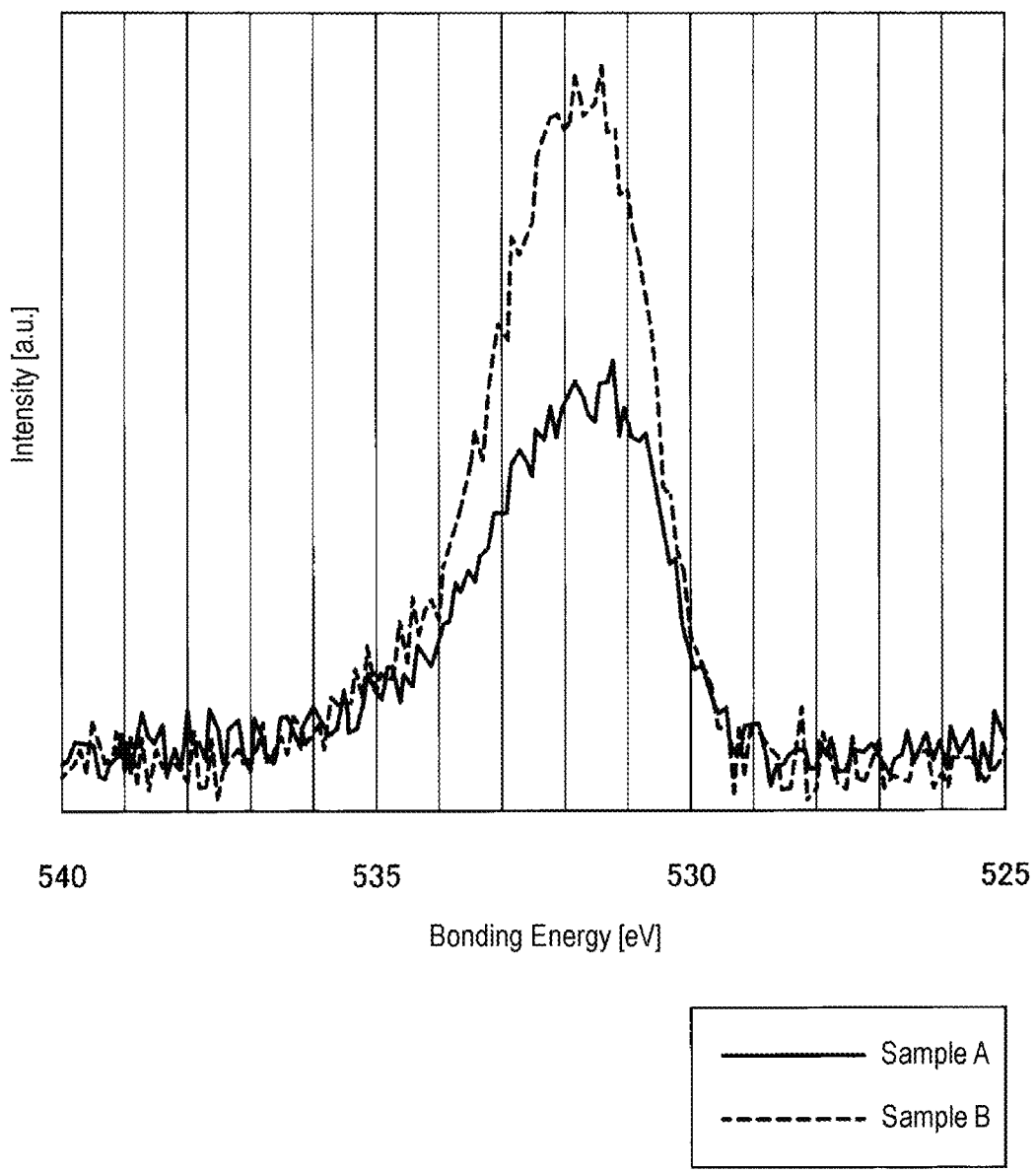

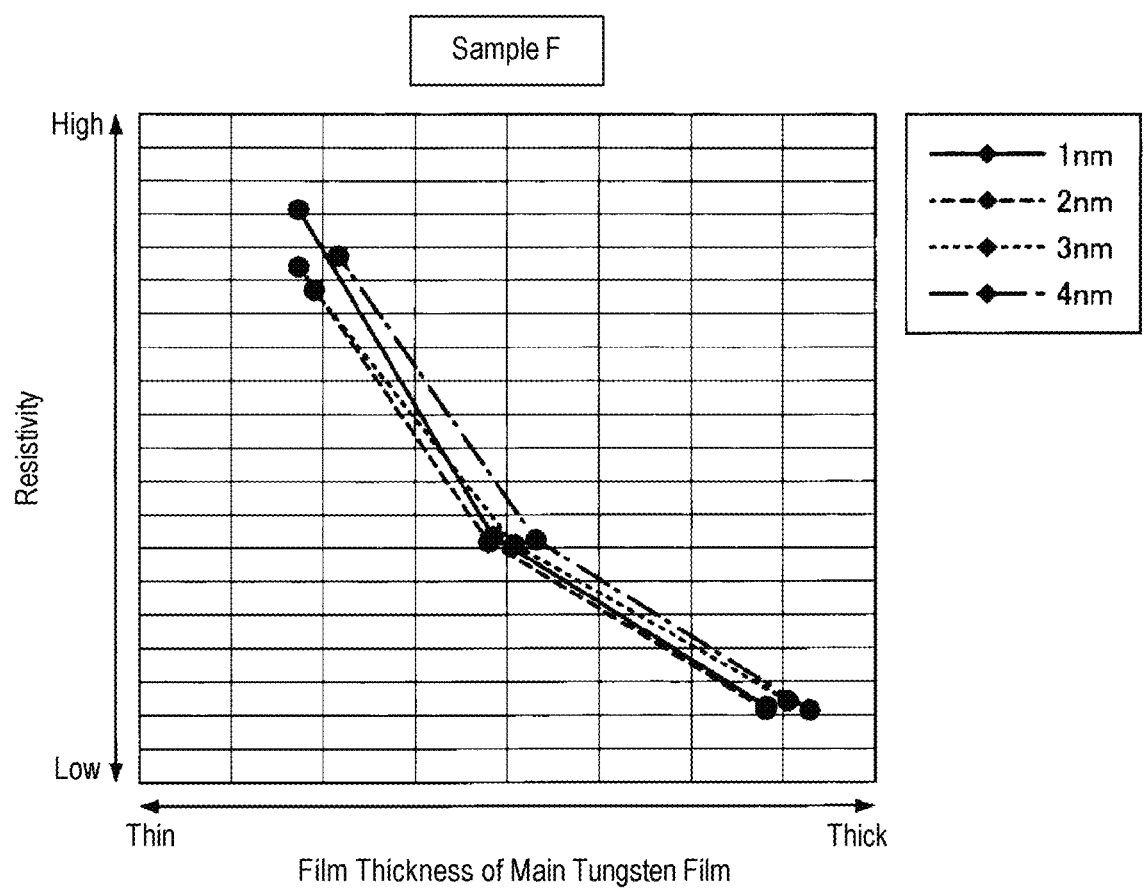

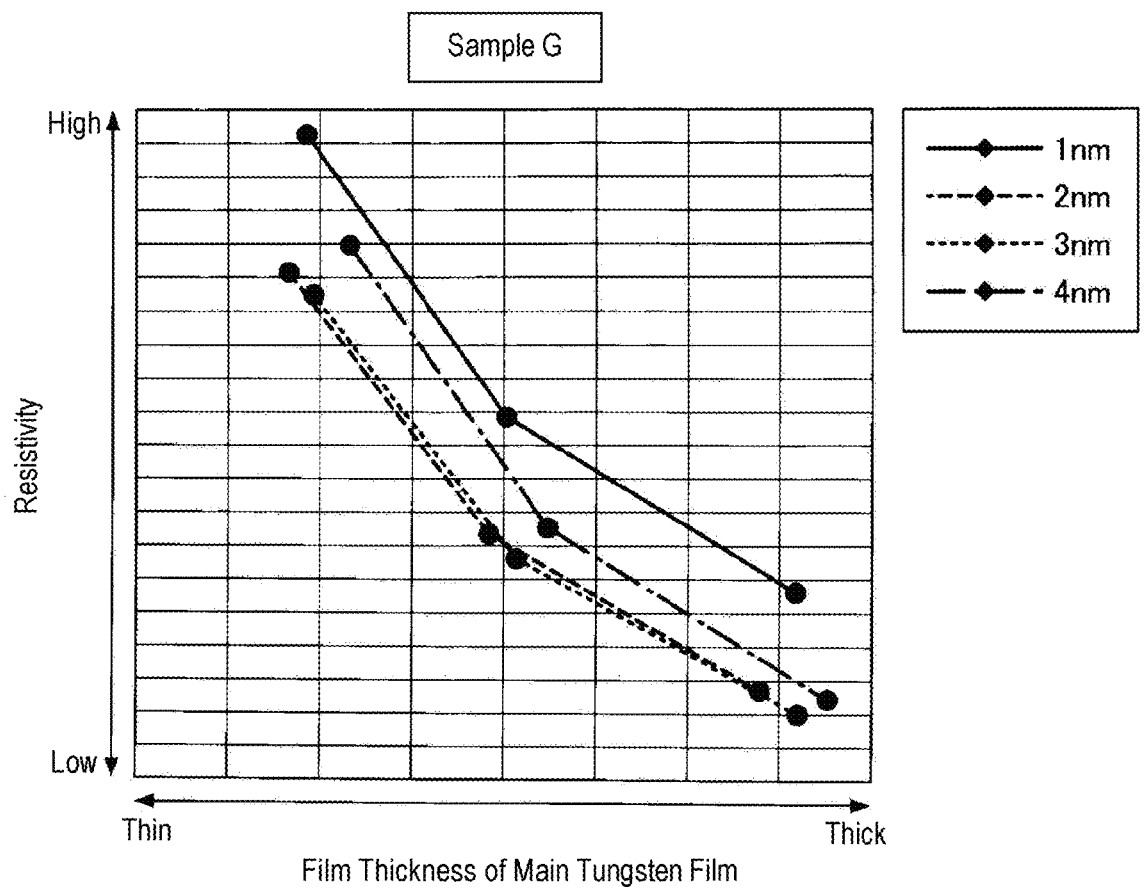

FILM FORMING METHOD AND SUBSTRATE PROCESSING SYSTEM

CROSS-REFERENCE TO RELATED APPLICATIONS

This application is based upon and claims the benefit of priority from Japanese Patent Application Nos. 2018-176324 and 2019-113063, filed on Sep. 20, 2018, and Jun. 18, 2019, respectively, the entire contents of which are incorporated herein by reference.

TECHNICAL FIELD

The present disclosure relates to a film forming method and a substrate processing system.

BACKGROUND

There is known a method of forming a low-resistance tungsten film on a TiN film without deteriorating adhesion to the TiN film and electrical properties (see, for example, Patent Document).

In such a method, first, an initial tungsten film is formed on the surface of a substrate by alternately supplying a $WF_6$ gas and an $H_2$ gas to the substrate while performing a purge process between the supply of the $WF_6$ gas and the supply of the $H_2$ gas. Subsequently, a gas containing a nucleation substance is adsorbed onto a surface of the initial tungsten film, and the $WF_6$ gas and the $H_2$ gas are supplied to form a crystalline shielding tungsten film for shielding the crystallinity of the initial tungsten film. Subsequently, the $WF_6$ gas of an increased flow rate and the $H_2$ gas are supplied to form a main tungsten film.

PRIOR ART DOCUMENT

Patent Documents

Patent Document 1: Japanese Laid-Open Patent Publication No. 2013-213274

SUMMARY

According to an embodiment of the present disclosure, there is provided a film forming method including: forming an Al-containing film on a base in a depressurized state; and subsequently, forming an initial tungsten film on the Al-containing film by alternately supplying a $B_2H_6$ gas and a $WF_6$ gas in a repetitive manner in the depressurized state without exposing the Al-containing film to an atmosphere while performing a purge process between the supply of the $B_2H_6$ gas and the supply of the $WF_6$ gas.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 1 is a flowchart illustrating an example of a film forming method.

FIG. 10 is a view showing the evaluation results of adhesion of tungsten films.

FIG. 12 is a view showing the evaluation results obtained by X-ray photoelectron spectroscopy (XPS).

FIGS. 13A and 13B are views showing the evaluation results of the relationship between a film thicknesses and resistivities of tungsten films.

FIG. 14 is a view showing evaluation results of adhesion of tungsten films.

DETAILED DESCRIPTION

Figure 2A:
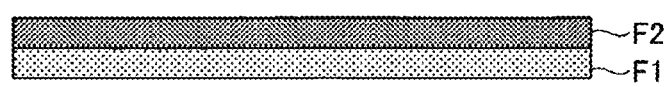
FIG. 2A to 2C are cross-sectional process views illustrating the example of the film forming method.

Hereinafter, non-limitative exemplary embodiments of the present disclosure will now be described with reference to the accompanying drawings. In all the accompanying drawings, the same or corresponding members or components will be denoted by the same or corresponding reference numerals, and redundant explanations thereof will be omitted. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

[Film-Forming Method]

Figure 2B:
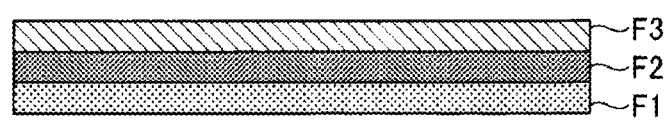
Figure 2C:
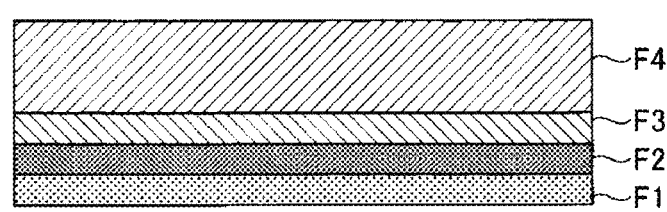

A film forming apparatus according to an embodiment will be described. FIG. 1 is a flowchart illustrating an example of a film forming method. FIGS. 2A to 2C are cross-sectional process views illustrating the example of the film forming method.

As illustrated in FIG. 1, the film forming method of an embodiment includes a step S10 of forming an Al-containing film, a step S20 of forming an initial tungsten film, and a step S30 of forming a main tungsten film. Each step will be described below.

Figure 3:
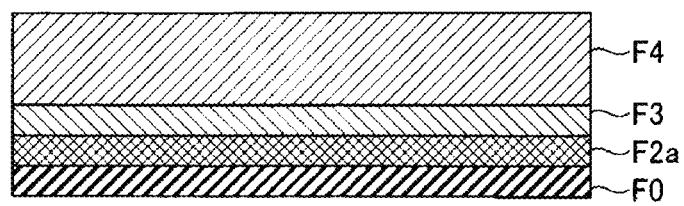
FIG. 3 is a view illustrating a case of using an AlTiN film as an Al-containing film.

The step S10 of forming an Al-containing film is a step of forming an Al-containing film F2 on a base film F1 in a depressurized state (see FIG. 2A). The step S10 of forming the Al-containing film may be a step of forming the Al-containing film F2 by an atomic layer deposition (ALD) method or a chemical vapor deposition (CVD) method. In an embodiment, the step S10 of forming the Al-containing film may be a step of forming the Al-containing film F2 on the base film F1 by alternately repeating the supply of an Al-containing gas and the supply of a nitrogen-containing gas in a depressurized state while performing a purge process between the supply of the Al-containing gas and the supply of the nitrogen-containing gas. The Al-containing gas may be a trimethylaluminum gas (TMA gas), and the nitrogen-containing gas may be an ammonia gas ($NH_3$ gas). In addition, the step S10 of forming the Al-containing film may be use a chemical vapor deposition method. Even if the base film F1 has orientation, such an orientation is canceled by the Al-containing film F2 formed on the base film F1. This increases the crystal size of a tungsten film to be formed in the step S20 of forming an initial tungsten film and the step S30 of forming a main tungsten film, which will be described later. Thus, it is possible to form a low-resistance tungsten film. The base film F1 may be a Ti-containing film such as a titanium nitride film (TiN film) formed on the substrate such as a semiconductor wafer. The Al-containing film F2 may be a non-crystalline (amorphous) aluminum nitride film (AlN film) on ground that the effect of canceling the orientation of the base film F1 is large. In addition, instead of the AlN film, an AlTiN film may be used. In the case of using the AlTiN film, as illustrated in FIG. 3, from the viewpoint of reducing a film thickness, an AlTiN film F2a may be formed directly on a substrate F0 without forming the base film F1 on the substrate F0. As an example, in the case of using a stacked film of the base film F1 (TiN film) and the Al-containing film F2 (AlN film), a film thickness of the stacked film is about 3 nm (TiN film: about 2 nm, AlN film: about 1 nm). In contrast, in the case of using the AlTiN film F2a, a film thickness of the AlTiN film is 1 to 2 nm. In addition, the AlTiN film may be amorphous from the viewpoint of increasing the crystal size of the tungsten film to form a low-resistance tungsten film.

The step S20 of forming an initial tungsten film is a step of forming an initial tungsten film F3 on a front surface of the Al-containing film F2 by alternately repeating the supply of a $B_2H_6$ gas and the supply of a $WF_6$ gas in a depressurized state while performing a purge process between the supply of the $B_2H_6$ gas and the supply of the $WF_6$ gas (see FIG. 2B). The step S20 of forming the initial tungsten film F3 is performed without exposing the Al-containing film F2 to atmosphere after the step S10 of forming the Al-containing film F2. The step S20 of forming an initial tungsten film is performed in a state in which the supply amount of the $WF_6$ gas is smaller than that in the step S30 of forming the main tungsten film. Therefore, since the amount of the $WF_6$ gas supplied in the step S20 of forming an initial tungsten film is small, an etched amount of the Al-containing film F2 is small. In addition, when forming the main tungsten film F4 by supplying the $WF_6$ gas of a large supply amount, the initial tungsten film F3 serves as a barrier of the $WF_6$ gas to the Al-containing film F2. This makes it possible to more effectively suppress the etching of the Al-containing film F2. The step S10 of forming an Al-containing film and the step S20 of forming an initial tungsten film may be performed in separate processing containers connected to each other through a vacuum transfer chamber, or may be performed in the same processing container.

The step S30 of forming a main tungsten film is a step of forming the main tungsten film F4 on the front surface of the initial tungsten film F3 by alternately repeating the supply of the $WF_6$ gas and the supply of the $H_2$ gas in a depressurized state while performing a purge process between the supply of the $WF_6$ gas and the supply of the $H_2$ gas (see FIG. 2C). The step S30 of forming a main tungsten film is performed after the step S20 of forming an initial tungsten film. In the step S30 of forming a main tungsten film, a tungsten chloride gas such as a $WCl_6$ gas or a $WCl_5$ gas may be used instead of the $WF_6$ gas. In the step S30 of forming a main tungsten film, a tungsten-containing gas such as a tungsten fluoride gas or the tungsten chloride gas may be used. In addition, instead of the $H_2$ gas, a reducing gas such as an $SiH_4$ gas, a $B_2H_6$ gas, or an $NH_3$ gas may be used. In addition, at least two gases selected from the group of the $H_2$ gas, the $SiH_4$ gas, the $B_2H_6$ gas, and the $NH_3$ gas may be used as the reducing gas. Furthermore, other reducing gases other than these gases, for example, a $PH_3$ gas and an $SiH_2Cl_2$ gas may be used. From the viewpoint of further reducing impurities in a film to obtain a low-resistance film, the $H_2$ gas may be used.

According to the film forming method described above, the Al-containing film F2 is formed on the base film F1, and the tungsten films (the initial tungsten film F3 and the main tungsten film F4) are formed on the Al-containing film F2. Therefore, even if the base film F1 has orientation, the orientation of the base film F1 is canceled by the Al-containing film F2. This increases the crystal size of the tungsten film, thus forming a low-resistance tungsten film.

In addition, after the step S10 of forming the Al-containing film F2, the step S20 of forming the initial tungsten film F3 on the Al-containing film F2 is performed by alternately repeating the supply of the $B_2H_6$ gas and the supply of the $WF_6$ gas in a depressurized state while performing a purge process between the supply of the $B_2H_6$ gas and the supply of the $WF_6$ gas without exposing the Al-containing film F2 to atmosphere. For this reason, it is possible to form the initial tungsten film F3 on the Al-containing film F2 without oxidizing the front surface of the Al-containing film F2 formed in the step S10. As a result, the Al-containing film F2 and the initial tungsten film F3 are stacked one above another with good adhesion.

[Substrate Processing System]

Figure 4:
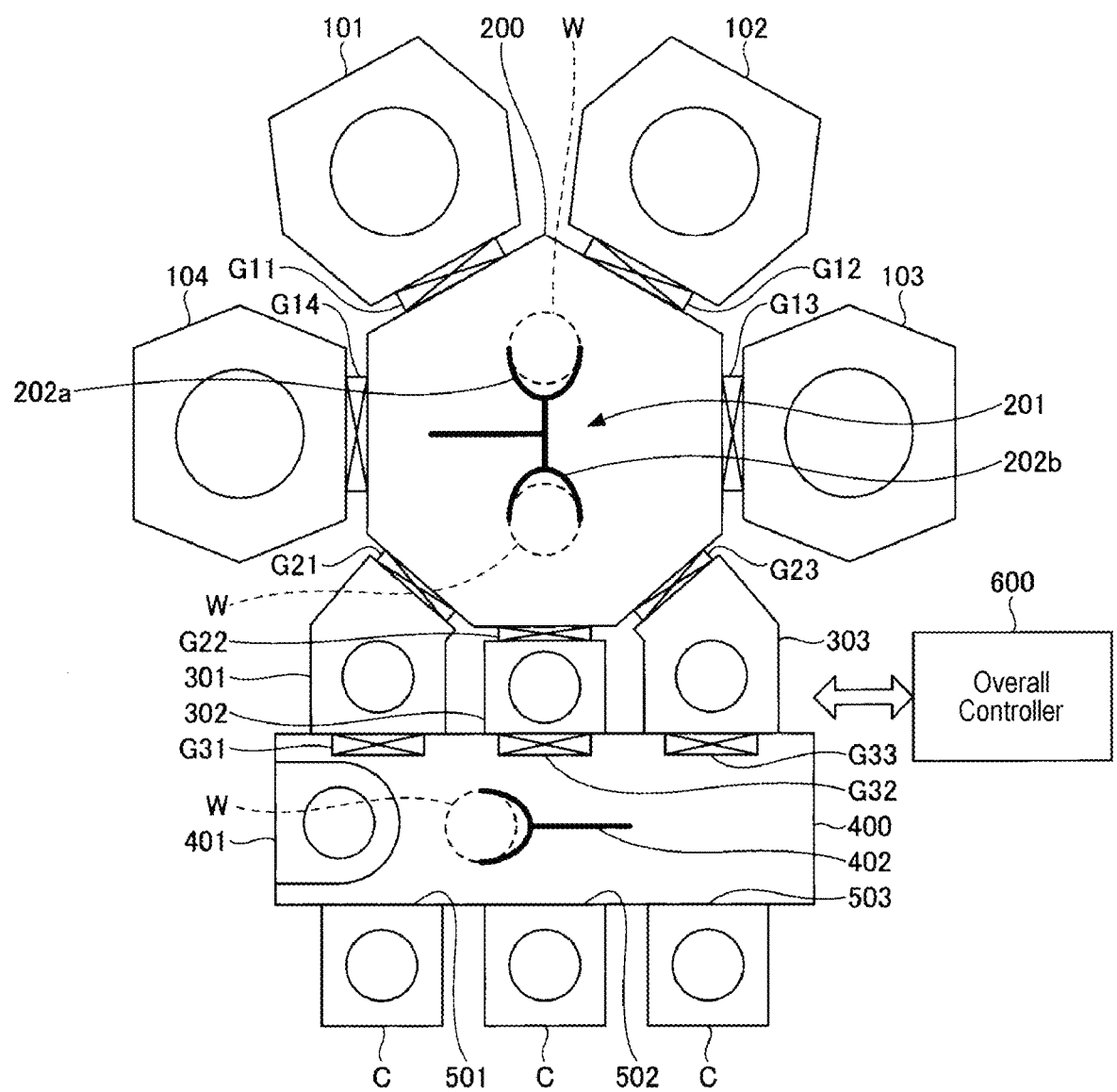
FIG. 4 is a schematic view illustrating an exemplary configuration of a substrate processing system.

A substrate processing system for implementing the film forming method described above will be described by taking, as an example, a case in which the step S10 of forming an Al-containing film, the step S20 of forming an initial tungsten film, and the step S30 of forming a main tungsten film are performed in separate processing containers connected to each other through a vacuum transfer chamber. FIG. 4 is a schematic view illustrating an exemplary configuration of the substrate processing system.

As illustrated in FIG. 4, the substrate processing system includes film forming apparatuses 101 to 104, a vacuum transfer chamber 200, load-lock chambers 301 to 303, an atmospheric transfer chamber 400, and load ports 501 to 503, and an overall controller 600.

The film forming apparatuses 101 to 104 are coupled to the vacuum transfer chamber 200 through gate valves G11 to G14, respectively. The interior of each of the film forming apparatuses 101 to 104 is depressurized to have a predetermined vacuum atmosphere. The wafer W is subjected to a predetermined process inside each of the film forming apparatuses 101 to 104. In an embodiment, the film forming apparatus 101 is an apparatus for forming the AlN film, the film forming apparatus 102 is an apparatus for forming the initial tungsten film, and the film forming apparatus 103 is an apparatus for forming the main tungsten film. The film forming apparatus 104 may be the same apparatus as any of the film forming apparatuses 101 to 103, or may be an apparatus for performing another process.

The interior of the vacuum transfer chamber 200 is depressurized to have a predetermined vacuum atmosphere. The vacuum transfer chamber 200 includes a transfer mechanism 201 capable of transferring the wafer W in a depressurized state. The transfer mechanism 201 transfers the wafer W between the film forming apparatuses 101 to 104 and the load-lock chambers 301 to 303. The transfer mechanism 201 includes two transfer arms 202a and 202b which are movable independently of one another.

The load-lock chambers 301 to 303 are coupled to the vacuum transfer chamber 200 through gate valves G21 to G23, respectively, and also coupled to the atmospheric transfer chamber 400 through gate valves G31 to G33, respectively. The interior of each of the load-lock chambers 301 to 303 is configured to be switched between an atmospheric environment and a vacuum atmosphere.

The interior of the atmospheric transfer chamber 400 is kept in the atmospheric environment. For example, the down-flow of clean air is formed inside the atmospheric transfer chamber 40. An aligner 401 is provided inside the atmospheric transfer chamber 400 to align the wafer W. In addition, the vacuum transfer chamber 400 includes a transfer mechanism 402. The transfer mechanism 402 transfers the wafer W between the load-lock chambers 301 to 303, carriers C in the load ports 501 to 502 (to be described later), and the aligner 401.

The load ports 501 to 503 are provided in the wall of a long side of the atmospheric transfer chamber 400. The carrier C in which the wafers W are accommodated or an empty carrier C is mounted on each of the load ports 501 to 503. A front opening unified pod (FOUP) may be used as the carrier C.

The overall controller 600 controls respective parts of the substrate processing system. For example, the overall controller 600 controls the operation of the film forming apparatuses 101 to 104, the operation of the transfer mechanisms 201 and 402, the opening/closing of the gate valves G11 to G14, G21 to G23, and G31 to G33, and the switching of the internal atmosphere of each of the load-lock chambers 301 to 303. The overall controller 600 may be a computer.

Figure 5:
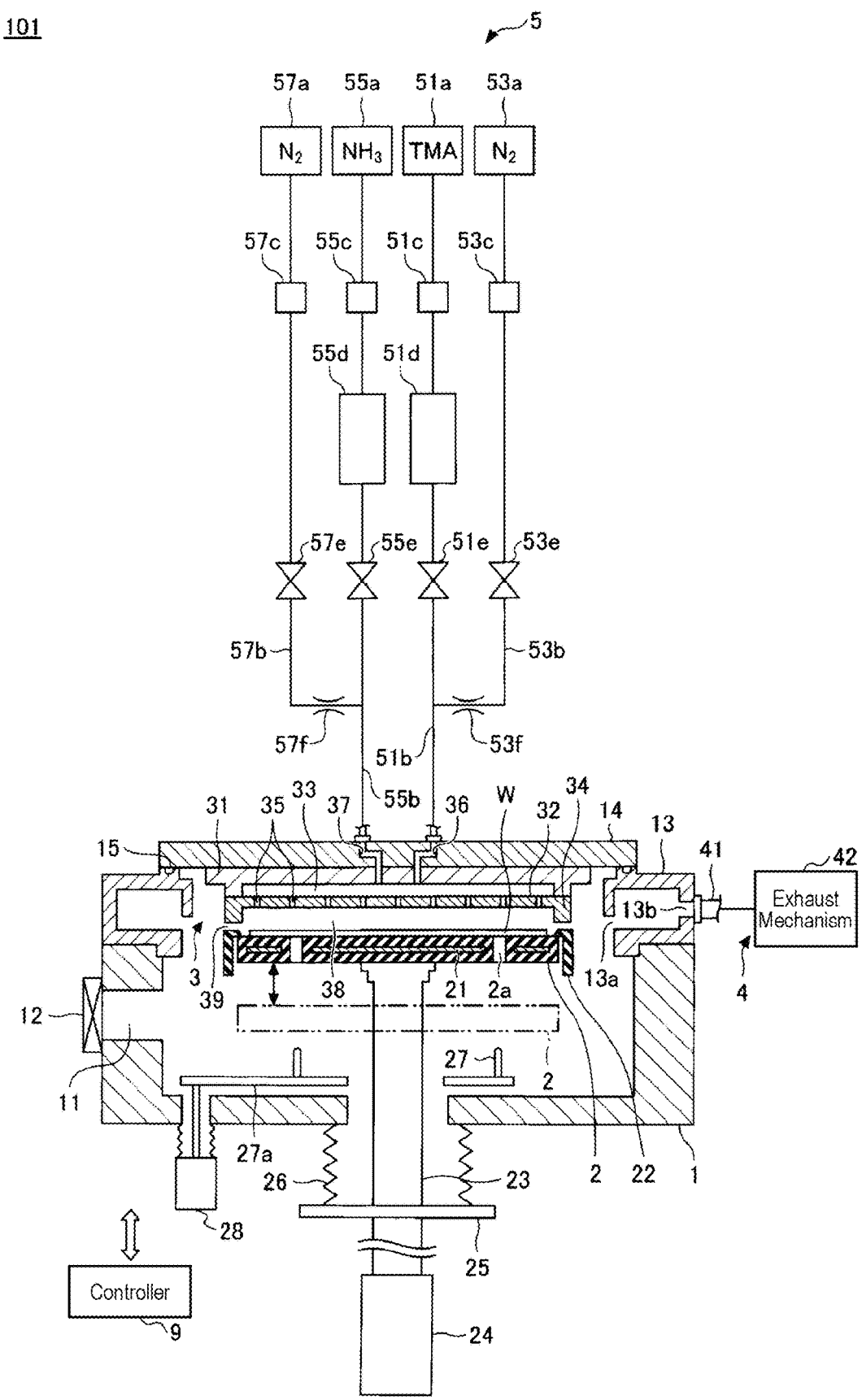
FIG. 5 is a schematic view illustrating an exemplary configuration of a film forming apparatus.

Next, an exemplary configuration of the film forming apparatus 101 will be described. The film forming apparatus 101 is an example of a first film forming apparatus that forms the AlN film inside the processing container kept in a depressurized state through an ALD method or a CVD method. FIG. 5 is a schematic view illustrating an exemplary configuration of the film forming apparatus 101.

As illustrated in FIG. 5, the film forming apparatus 101 includes a processing container 1, a stage 2, a shower head 3, an exhaust part 4, a gas supply mechanism 5, and a controller 9.

The processing container 1 is made of a metal such as aluminum, and has a substantially cylindrical shape. The processing container 1 accommodates the wafer W. A loading/unloading port 11 through which the wafer W is transferred is formed in the side wall of the processing container 1. The loading/unloading port 11 is opened/closed by a gate valve 12. An annular exhaust duct 13 having a rectangular cross section is provided on a main body of the processing container 1. A slit 13a is formed in the exhaust duct 13 along an inner peripheral surface of the exhaust duct 13. An exhaust port 13b is formed in the outer wall of the exhaust duct 13. A ceiling wall 14 is provided on an upper surface of the exhaust duct 13 so as to close an upper opening of the processing container 1. The exhaust duct 13 and the ceiling wall 14 is hermetically sealed from each other through a seal ring 15.

The stage 2 horizontally supports the wafer W in the processing container 1. The stage 2 is formed in a disk shape having a size corresponding to the wafer W, and is supported by a support member 23. The stage 2 is formed of a ceramic material such as AlN or a metal material such as aluminum or nickel alloy. A heater 21 is embedded in the stage 2 to heat the wafer W. The heater 21 generates heat based on power provided from a heater power supply (not illustrated). The wafer W is controlled to have a predetermined temperature by controlling the output of the heater 21 based on a temperature signal of a thermocouple (not illustrated) provided in the vicinity of the upper surface of the stage 2. The stage 2 is provided with a cover member 22 formed of ceramics such as alumina so as to cover an outer peripheral area of the upper surface and the side surface thereof.

The support member 23 is provided on the bottom surface of the stage 2 to support the stage 2. The support member 23 extends downward of the processing container 1 from the center of the bottom surface of the stage 2 and penetrates through a hole formed in the bottom wall of the processing container 1. A lower end of the support member 123 is connected to a lifting mechanism 24. The stage 2 is moved upward and downward via the support member 23 by the lifting mechanism 24 between a processing position illustrated in FIG. 5 and a transfer position indicated by a dashed double-dotted line below the processing position where the wafer W is transferred. A flange part 25 is provided on the support member 23 below the processing container 1. A bellows 26, which isolates the internal atmosphere of the processing container 1 from atmosphere, is provided between the bottom surface of the processing container 1 and the flange part 25. The bellows 26 expands and contracts along with the upward and downward movement of the stage 2.

Three wafer support pins 27 (only two are illustrated in FIG. 2) are provided in the vicinity of the bottom surface of the processing container 1 to protrude upward from a lifting plate 27a. The wafer support pins 27 are moved upward and downward via the lifting plate 27a by a lifting mechanism 28 provided below the processing container 1. The wafer support pins 27 are inserted into respective through-holes 2a provided in the stage 2 when the stage 2 is located at the transfer position, and are moved upward and downward on the upper surface of the stage 2. By moving upward and downward the wafer support pins 27, the wafer W is delivered between a wafer transfer mechanism (not illustrated) and the stage 2.

The shower head 3 supplies a processing gas into the processing container 1 in the form of a shower. The shower head 3 is made of metal, and is provided to face the stage 2. The shower head 3 has a diameter, which is substantially the same as that of the stage 2. The shower head 3 includes a main body 31 fixed to the ceiling wall 14 of the processing container 1 and a shower plate 32 connected to the lower side of the main body 31. A gas diffusion space 33 is formed between the main body 31 and the shower plate 32. Gas introduction holes 36 and 37, which penetrate through the ceiling wall 14 of the processing container 1 and the center of the main body 31, are connected to the gas diffusion space 33. A protruded portion 34 annularly protruding downward is formed on a peripheral edge of the shower plate 32. Gas ejection holes 35 are formed in a flat surface inward of the protruded portion 34. In the state in which the stage 2 is located at the processing position, a processing space 38 is formed between the stage 2 and the shower plate 32. An upper surface of the cover member 22 and the protruded portion 34 are close to each other so as to form an annular gap 39.

The exhaust part 4 exhausts the interior of the processing container 1. The exhaust part 4 includes an exhaust pipe 41 connected to the exhaust port 13b, and an exhaust mechanism 42 connected to the exhaust pipe 41. The exhaust mechanism 42 includes a vacuum pump, a pressure control valve and the like. During the processing, the gas in the processing container 1 reaches the exhaust duct 13 via the slit 13a, and is exhausted from the exhaust duct 13 through the exhaust pipe 41 by the exhaust mechanism 42.

The gas supply mechanism 5 supplies the processing gas into the processing container 1. The gas supply mechanism 5 includes an Al-containing gas source 51a, an $N_2$ gas source 53a, a reaction gas source 55a, and an $N_2$ gas source 57a.

The Al-containing gas source 51a supplies a TMA gas, which is an Al-containing gas, into the processing container 1 through a gas supply line 51b. The gas supply line 51b is provided with a flow rate controller 51c, a storage tank 51d, and a valve 51e from the upstream side. The downstream side of the valve 51e in the gas supply line 51b is connected to the gas introduction hole 36. The TMA gas supplied from the Al-containing gas source 51a is temporarily stored in the storage tank 51d before being supplied into the processing container 1, so that an internal pressure of the storage tank 51d is increased to a predetermined pressure. Thereafter, the TMA gas is supplied into the processing container 1. The supply and cutoff of the TMA gas from the storage tank 51d into the processing container 1 are performed by the opening/closing of the valve 51e. By temporarily storing the TMA gas in the storage tank 51d as described above, it is possible to stably supply the TMA gas into the processing container 1 at a relatively large flow rate.

The $N_2$ gas source 53a supplies the $N_2$ gas, which is a carrier gas, into the processing container 1 through a gas supply line 53b. The gas supply line 53b is provided with a flow rate controller 53c, a valve 53e, and an orifice 53f from the upstream side. The downstream side of the orifice 53f in the gas supply line 53b is connected to the gas supply line 51b. The $N_2$ gas supplied from the $N_2$ gas source 53a is continuously supplied into the processing container 1 during the film formation on the wafer W. The supply and cutoff of the $N_2$ gas from the $N_2$ gas source 53a into the processing container 1 are performed by the opening/closing of the valve 53e. Although the gas is supplied to the gas supply line 51b at a relatively large flow rate by the storage tank 51d, the gas supplied to the gas supply line 51b is prevented from flowing backward to the $N_2$ gas supply line 53b by the orifice 53f.

The reaction gas source 55a supplies the $NH_3$ gas, which is a nitrogen-containing gas as a reaction gas, into the processing container 1 through a gas supply line 55b. The gas supply line 55b is provided with a flow rate controller 55c, a storage tank 55d, and a valve 55e from the upstream side. The downstream side of the valve 55e in the gas supply line 55b is connected to the gas introduction hole 37. The $NH_3$ gas supplied from the reaction gas source 55a is temporarily stored in the storage tank 55d before being supplied into the processing container 1, so that an internal pressure of the storage tank 55d is increased to a predetermined pressure. Thereafter, the $NH_3$ gas is supplied into the processing container 1. The supply and cutoff of the $NH_3$ gas from the storage tank 55d into the processing container 1 are performed by the opening/closing of the valve 55e. By temporarily storing the $NH_3$ gas in the storage tank 55d as described above, it is possible to stably supply the $NH_3$ gas into the processing container 1 at a relatively large flow rate.

The $N_2$ gas source 57a supplies the $N_2$ gas, which is a carrier gas, into the processing container 1 through a gas supply line 57b. The gas supply line 57b is provided with a flow rate controller 57c, a valve 57e, and an orifice 57f from the upstream side. The downstream side of the orifice 57f in the gas supply line 57b is connected to a gas supply line 55b.

The $N_2$ gas supplied from the $N_2$ gas source 57a is continuously supplied into the processing container 1 during the film formation on the wafer W. The supply and cutoff of the $N_2$ gas from the $N_2$ gas source 57a to the processing container 1 are performed by the opening/closing of the valve 57e. Although the gas is supplied to the gas supply line 55b at a relatively large flow rate by the storage tank 55d, the gas supplied to the gas supply line 55b is prevented from flowing backward to the $N_2$ gas supply line 57b by the orifice 57f.

The controller 9 may be a computer, and includes a central processing unit (CPU), a random access memory (RAM), a read only memory (ROM), an auxiliary storage device, and the like. The CPU operates based on a program stored in the ROM or the auxiliary storage device, and controls the operations of the film forming apparatus 101. The controller 9 may be provided either inside or outside the film forming apparatus 101. In the case where the controller 9 is provided outside the film forming apparatus 101, the controller 9 is capable of controlling the film forming apparatus 101 through a wired or wireless communication means.

In the foregoing, the film forming apparatus 101 for forming the AlN film has been described above as an example of a film forming apparatus for forming the Al-containing film F2. However, in the case where the Al-containing film F2 is an AlTiN film, a film forming apparatus 101A described below may be used instead of the film forming apparatus 101 described above.

Figure 6:
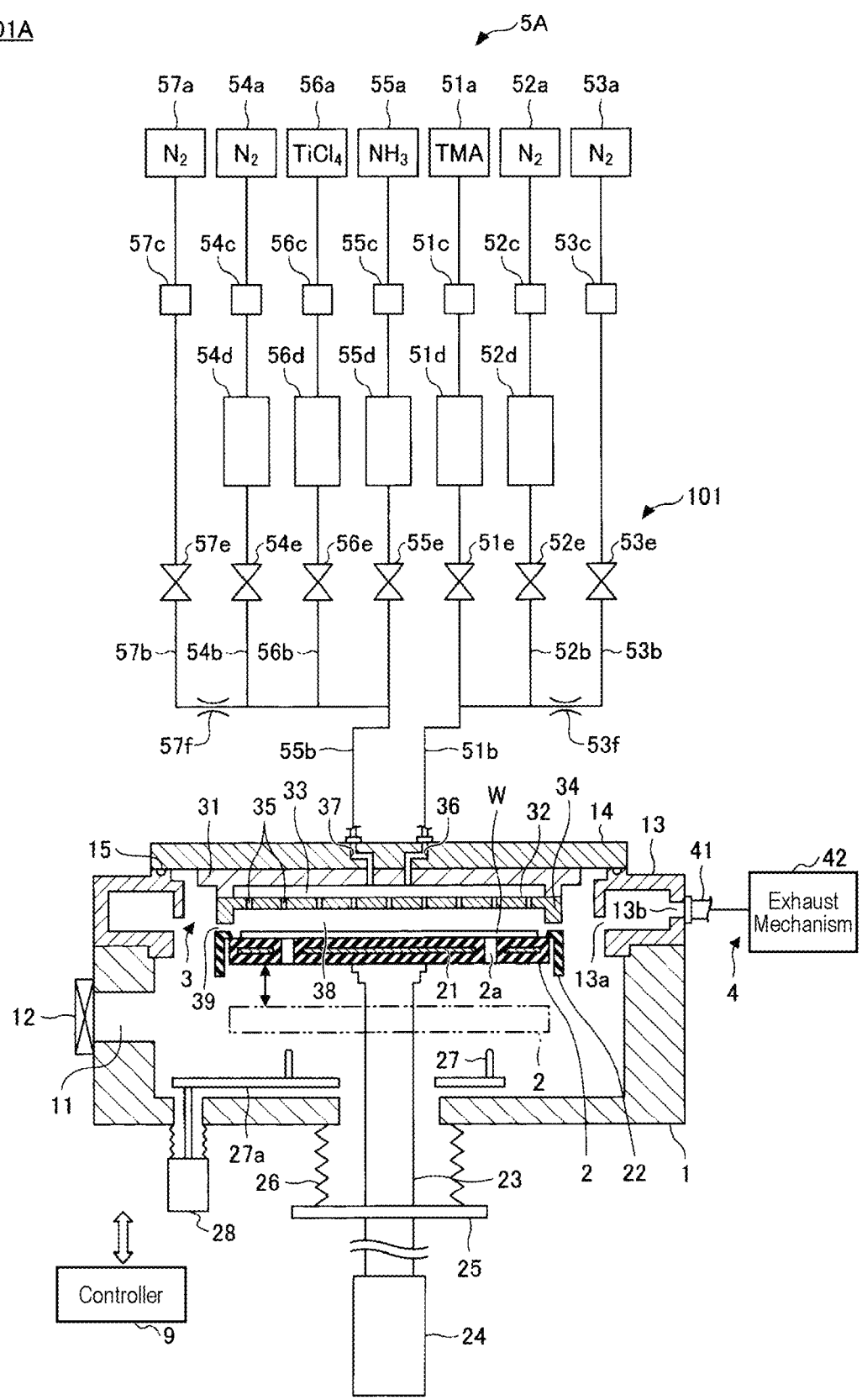
FIG. 6 is a schematic view illustrating an exemplary configuration of a film forming apparatus.

FIG. 6 is a view illustrating an exemplary configuration of the film forming apparatus 101A. As illustrated in FIG. 6, the film forming apparatus 101A differs from the film forming apparatus 101 in that the film forming apparatus 101A includes a gas supply mechanism 5A instead of the gas supply mechanism 5 in the film forming apparatus 101. Other points are the same as those of the film forming apparatus 101. Thus, the film forming apparatus 101A will be described with a focus on the differences from the film forming apparatus 101.

The gas supply mechanism 5A is connected to the gas introduction holes 36 and 37 so as to supply various gases to be used for film formation. The gas supply mechanism 5A includes, as gas sources for forming the AlTiN film, the Al-containing gas source 51a, an $N_2$-containing gas source 52a, the $N_2$ gas source 53a, the $N_2$ gas source Ma, a reaction gas source 55a, a Ti-containing gas source 56a, and the $N_2$ gas source 57a. In addition, in the gas supply mechanism 5A illustrated in FIG. 6, although the gas sources are shown to be individually provided, the gas sources may be used in a collective manner as long as they can be communalized into a single gas source.

The Al-containing gas source 51a supplies the Al-containing gas into the processing container 1 through the gas supply line 51b. Examples of the Al-containing gas may include an $AlCl_3$ gas and a trimethylaluminum (TMA: $C_6H_{18}Al_2$) gas. In the embodiment of FIG. 6, the Al-containing gas source 51a supplies the TMA gas as the Al-containing gas. The gas supply line 51b is provided with the flow rate controller 51c, the storage tank 51d, and the valve 51e from the upstream side. The downstream side of the valve 51e in the gas supply line 51b is connected to the gas introduction hole 36. The TMA gas supplied from the Al-containing gas source 51a is temporarily stored in the storage tank 51d before being supplied into the processing container 1, so that the internal pressure of the storage tank 51d is increased to a predetermined pressure. Thereafter, the TMA gas is supplied into the processing container 1. The supply and cutoff of the TMA gas from the storage tank 51d into the processing container 1 are performed by the valve 51e. By temporarily storing the TMA gas in the storage tank 51d as described above, it is possible to stably supply the TMA gas into the processing container 1 at a relatively large flow rate.

The $N_2$ gas source 52a supplies the $N_2$ gas, which is a purge gas, into the processing container 1 through a gas supply line 52b. The gas supply line 52b is provided with a flow rate controller 52c, a storage tank 52d, and a valve 52e from the upstream side. The downstream side of the valve 52e in the gas supply line 52b is connected to the gas supply line 51b. The $N_2$ gas supplied from the $N_2$ gas source 52a is temporarily stored in the storage tank 52d before being supplied into the processing container 1, so that the internal pressure of the storage tank 52d is increased to a predetermined pressure. Thereafter, the $N_2$ gas is supplied into the processing container 1. The supply and cutoff of the $N_2$ gas from the storage tank 52d into the processing container 1 are performed by the valve 52e. By temporarily storing the $N_2$ gas in the storage tank 52d as described above, it is possible to stably supply the $N_2$ gas into the processing container 1 at a relatively large flow rate.

The $N_2$ gas source 53a supplies the $N_2$ gas, which is a carrier gas, into the processing container 1 through the gas supply line 53b. The gas supply line 53b is provided with the flow rate controller 53c, the valve 53e, and the orifice 53f from the upstream side. The downstream side of the orifice 53f in the gas supply line 53b is connected to the gas supply line 51b. The $N_2$ gas supplied from the $N_2$ gas source 53a is continuously supplied into the processing container 1 during the film formation on the wafer W. The supply and cutoff of the $N_2$ gas from the $N_2$ gas source 53a into the processing container 1 are performed by the valve 53e. Although the gases are supplied to the gas supply lines 51b and 52b at a relatively large flow rate by the storage tanks 51d and 52d, respectively, the gases supplied to the gas supply line 51b are prevented from flowing backward to the gas supply line 53b by the orifice 53f.

The $N_2$ gas source 54a supplies the $N_2$ gas, which is a purge gas, into the processing container 1 through a gas supply line 54b. The gas supply line 54b is provided with a flow rate controller 54c, a storage tank 54d, and a valve 54e from the upstream side. The downstream side of the valve 54e in the gas supply line 54b is connected to the gas supply line 55b. The $N_2$ gas supplied from the $N_2$ gas source 54a is temporarily stored in the storage tank 54d before being supplied into the processing container 1, so that the internal pressure of the storage tank 54d is increased to a predetermined pressure. Thereafter, the $N_2$ gas is supplied into the processing container 1. The supply and cutoff of the $N_2$ gas from the storage tank 54d into the processing container 1 are performed by the valve 54e. By temporarily storing the $N_2$ gas in the storage tank 54d as described above, it is possible to stably supply the $N_2$ gas into the processing container 1 at a relatively large flow rate.

The reaction gas source 55a supplies the reaction gas into the processing container 1 through the gas supply line 55b. An example of the reaction gas may include a nitrogen-containing gas, such as an $NH_3$ gas, an $N_2H_4$ gas or the like. In the embodiment of FIG. 6, the reaction gas source 55a supplies the $NH_3$ gas as the reaction gas. The gas supply line 55b is provided with the flow rate controller 55c, the storage tank 55d, and the valve 55e from the upstream side. The downstream side of the valve 55e in the gas supply line 55b is connected to the gas introduction hole 37. The $NH_3$ gas supplied from the reaction gas source 55a is temporarily stored in the storage tank 55d before being supplied into the processing container 1, so that the internal pressure of the storage tank 55d is increased to a predetermined pressure. Thereafter, the $NH_3$ gas is supplied into the processing container 1. The supply and cutoff of the $NH_3$ gas from the storage tank 51d into the processing container 1 are performed by the valve 55e. By temporarily storing the $NH_3$ gas in the storage tank 55d as described above, it is possible to stably supply the $NH_3$ gas into the processing container 1 at a relatively large flow rate.

The Ti-containing gas source 56a supplies a Ti-containing gas into the processing container 1 through a gas supply line 56b. Examples of the Ti-containing gas may include a $TiCl_4$ gas, a tetrakis (dimethylamino) titanium (TDMAT: Ti[N(CH$_3$)$_2$]$_4$) gas, and a tetrakis (methylethylamino) titanium (TMEAT: $C_{12}H_{32}N_4Ti$) gas. In the embodiment of FIG. 6, the Ti-containing gas source 56a supplies the $TiCl_4$ gas as the Ti-containing gas. The gas supply line 56b is provided with a flow rate controller 56c, a storage tank 56d, and a valve 56e from the upstream side. The downstream side of the valve 56e in the gas supply line 56b is connected to the gas supply line 55b. The Ti-containing gas supplied from the Ti-containing gas source 56a is temporarily stored in the storage tank 56d before being supplied into the processing container 1, so that the internal pressure of the storage tank 56d is increased to a predetermined pressure. Thereafter, the Ti-containing gas is supplied into the processing container 1. The supply and cutoff of the Ti-containing gas from the storage tank 56d into the processing container 1 are performed by the valve 56e. By temporarily storing the Ti-containing gas in the storage tank 56d as described above, it is possible to stably supply the Ti-containing gas into the processing container 1 at a relatively large flow rate.

The $N_2$ gas source 57a supplies the $N_2$ gas, which is a carrier gas, into the processing container 1 through the gas supply line 57b. The gas supply line 57b is provided with the flow rate controller 57c, the valve 57e, and then orifice 57f from the upstream side. The downstream side of the orifice 57f in the gas supply line 57b is connected to the gas supply line 55b. The $N_2$ gas supplied from the $N_2$ gas source 57a is continuously supplied into the processing container 1 during the film formation on the wafer W. The supply and cutoff of the $N_2$ gas from the $N_2$ gas source 57a into the processing container 1 are performed by the valve 57e. Although the gases are supplied to the gas supply lines 55b and 56b at a relatively large flow rate by the storage tanks 55d and 56d, respectively, the gases supplied to the gas supply line 55b are prevented from flowing backward to the gas supply line 57b by the orifice 57f.

Figure 7:
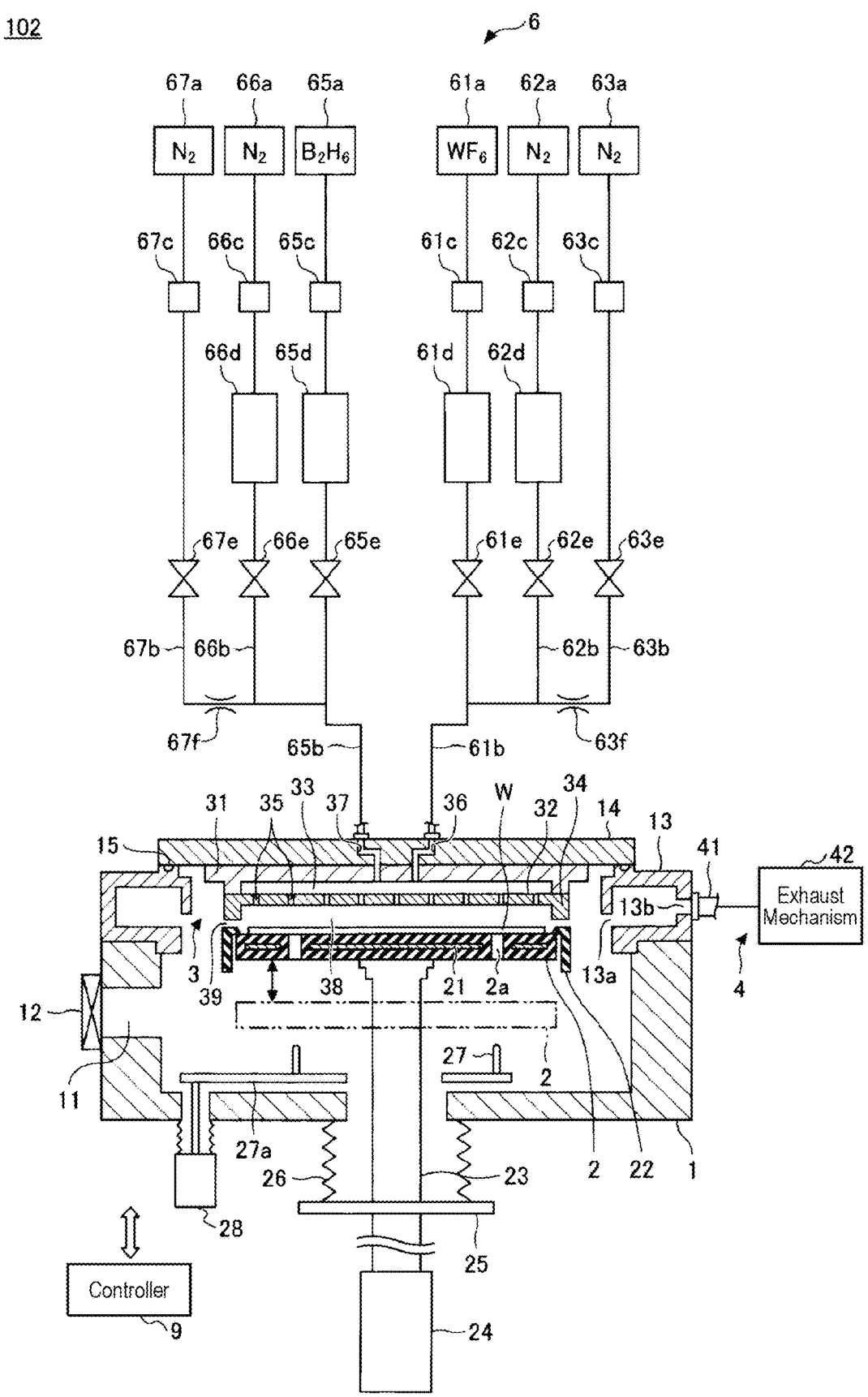
FIG. 7 is a schematic view illustrating an exemplary configuration of a film forming apparatus.

Next, an exemplary configuration of the film forming apparatus 102 will be described. The film forming apparatus 102 is an example of a second film forming apparatus that forms an initial tungsten film inside a processing container kept in a depressurized state through an ALD method. FIG. 7 is a schematic view illustrating the exemplary configuration of the film forming apparatus 102.

As illustrated in FIG. 7, the film forming apparatus 102 differs from the film forming apparatus 101 in that the film forming apparatus 102 includes a gas supply mechanism 6 instead of the gas supply mechanism 5 in the film forming apparatus 101. Other points are similar to those of the film forming apparatus 101. Thus, the film forming apparatus 102 will be described with a focus on the differences from the film forming apparatus 101.

The gas supply mechanism 6 supplies a processing gas into the processing container 1. The gas supply mechanism 6 includes a $WF_6$ gas source 61a, an $N_2$ gas source 62a, an $N_2$ gas source 63a, a $B_2H_6$ gas source 65a, an $N_2$ gas source 66a, and an $N_2$ gas source 67a.

The $WF_6$ gas source 61a supplies a $WF_6$ gas into the processing container 1 through a gas supply line 61b. The gas supply line 61b is provided with a flow rate controller 61c, a storage tank 61d, and a valve 61e from the upstream side. The downstream side of the valve 61e in the gas supply line 61b is connected to the gas introduction hole 36. The $WF_6$ gas supplied from the $WF_6$ gas source 61a is temporarily stored in the storage tank 61d before being supplied into the processing container 1, so that the internal pressure of the storage tank 61d is increased to a predetermined pressure. Thereafter, the $WF_6$ gas is supplied into the processing container 1. The supply and cutoff of the $WF_6$ gas from the storage tank 61d into the processing container 1 are performed by the opening/closing of the valve 61e. By temporarily storing the $WF_6$ gas in the storage tank 61d as described above, it is possible to stably supply the $WF_6$ gas into the processing container 1 at a relatively large flow rate.

The $N_2$ gas source 62a supplies an $N_2$ gas, which is a purge gas, into the processing container 1 through a gas supply line 62b. The gas supply line 62b is provided with a flow rate controller 62c, a storage tank 62d, and a valve 62e from the upstream side. The downstream side of the valve 62e in the gas supply line 62b is connected to the gas supply line 61b. The $N_2$ gas supplied from the $N_2$ gas source 62a is temporarily stored in the storage tank 62d before being supplied into the processing container 1, so that the internal pressure of the storage tank 62d is increased to a predetermined pressure. Thereafter, the $N_2$ gas is supplied into the processing container 1. The supply and cutoff of the $N_2$ gas from the storage tank 62d into the processing container 1 are performed by the opening/closing of the valve 62e. By temporarily storing the $N_2$ gas in the storage tank 62d as described above, it is possible to stably supply the $N_2$ gas into the processing container 1 at a relatively large flow rate.

The $N_2$ gas source 63a supplies an $N_2$ gas, which is a carrier gas, into the processing container 1 through a gas supply line 63b. The gas supply line 63b is provided with a flow rate controller 63c, a valve 63e, and an orifice 63f from the upstream side. The downstream side of the orifice 63f in the gas supply line 63b is connected to the gas supply line 61b. The $N_2$ gas supplied from the $N_2$ gas source 63a is continuously supplied into the processing container 1 during the film formation on the wafer W. The supply and cutoff of the $N_2$ gas from the $N_2$ gas source 63a into the processing container 1 are performed by the opening/closing of the valve 63e. Although the gases are supplied to the gas supply lines 61b and 62b at a relatively large flow rate by the storage tanks 61d and 62d, respectively, the gases supplied to the gas supply lines 61b and 62b are prevented from flowing backward to the $N_2$ gas supply line 63b by the orifice 63f.

The $B_2H_6$ gas source 65a supplies a $B_2H_6$ gas, which is a reducing gas, into the processing container 1 through a gas supply line 65b. The gas supply line 65b is provided with a flow rate controller 65c, a storage tank 65d, and a valve 65e from the upstream side. The downstream side of the valve 65e in the gas supply line 65b is connected to the gas introduction hole 37. The $B_2H_6$ gas supplied from the $B_2H_6$ gas source 65a is temporarily stored in the storage tank 65d before being supplied into the processing container 1, so that the internal pressure of the storage tank 65d is increased to a predetermined pressure. Thereafter, the $B_2H_6$ gas is supplied into the processing container 1. The supply and cutoff of the $B_2H_6$ gas from the storage tank 65d into the processing container 1 are performed by the opening/closing of the valve 65e. By temporarily storing the $B_2H_6$ gas in the storage tank 65d as described above, it is possible to stably supply the $B_2H_6$ gas into the processing container 1 at a relatively large flow rate.

The $N_2$ gas source 66a supplies an $N_2$ gas, which is a purge gas, into the processing container 1 through a gas supply line 66b. The gas supply line 66b is provided with a flow rate controller 66c, a storage tank 66d, and a valve 66e from the upstream side. The downstream side of the valve 66e in the gas supply line 66b is connected to the gas supply line 65b. The $N_2$ gas supplied from the $N_2$ gas source 66a is temporarily stored in the storage tank 66d before being supplied into the processing container 1, so that the internal pressure of the storage tank 66d is increased to a predetermined pressure. Thereafter, the $N_2$ gas is supplied into the processing container 1. The supply and cutoff of the $N_2$ gas from the storage tank 66d into the processing container 1 are performed by the opening/closing of the valve 66e. By temporarily storing the $N_2$ gas in the storage tank 66d as described above, it is possible to stably supply the $N_2$ gas into the processing container 1 at a relatively large flow rate.

The $N_2$ gas source 67a supplies an $N_2$ gas, which is a carrier gas, into the processing container 1 through a gas supply line 67b. The gas supply line 67b is provided with a flow rate controller 67c, a valve 67e, and an orifice 67f from the upstream side. The downstream side of the orifice 67f in the gas supply line 67b is connected to the gas supply line 65b. The $N_2$ gas supplied from the $N_2$ gas source 67a is continuously supplied into the processing container 1 during the film formation on the wafer W. The supply and cutoff of the $N_2$ gas from the $N_2$ gas source 67a into the processing container 1 are performed by the opening/closing of the valve 67e. Although the gases are supplied to the gas supply lines 65b and 66b at a relatively large flow rate by the storage tanks 65d and 66d, respectively, the gases supplied to the gas supply lines 65b and 66b are prevented from flowing backward to the $N_2$ gas supply line 67b by the orifice 67f.

Figure 8:
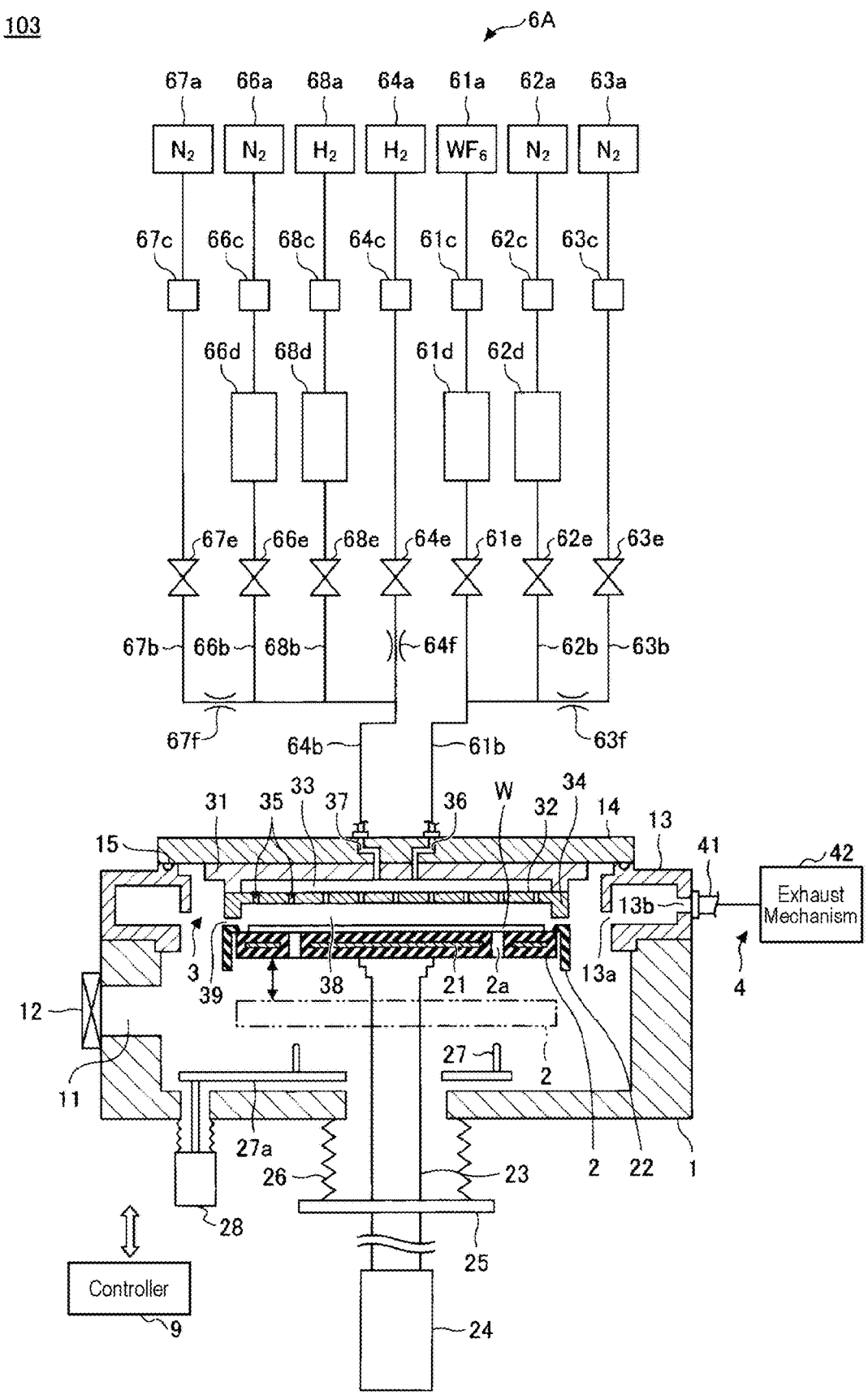
FIG. 8 is a schematic view illustrating an exemplary configuration of a film forming apparatus.

Next, an exemplary configuration of the film forming apparatus 103 will be described. The film forming apparatus 103 is an apparatus that forms a main tungsten film in a processing container kept in a depressurized state through an ALD method. FIG. 8 is a schematic view illustrating the exemplary configuration of the film forming apparatus 103.

As illustrated in FIG. 8, the film forming apparatus 103 differs from the film forming apparatus 102 in that the film forming apparatus 103 includes a gas supply mechanism 6A instead of the gas supply mechanism 6 in the film forming apparatus 102. Other points are similar to those of the film forming apparatus 102. Thus, the film forming apparatus 103 will be described with a focus on the differences from the film forming apparatus 102.

The gas supply mechanism 6A includes an $H_2$ gas source 64a and an $H_2$ gas source 68a instead of the $B_2H_6$ gas source 65a of the gas supply mechanism 6 in the film forming apparatus 102. The configurations of the $WF_6$ gas source 61a, the $N_2$ gas source 62a, the $N_2$ gas source 63a, the $N_2$ gas source 66a, and the $N_2$ gas source 67a are the same as those of the film forming apparatus 102.

The $H_2$ gas source 64a supplies an $H_2$ gas, which is a reducing gas, into the processing container 1 through a gas supply line 64b. The gas supply line 64b is provided with a flow rate controller 64c, a valve 64e, and an orifice 64f from the upstream side. The downstream side of the orifice 64f in the gas supply line 64b is connected to the gas introduction hole 37. The $H_2$ gas supplied from the $H_2$ gas source 64a is continuously supplied into the processing container 1 during the film formation on the wafer W. The supply and cutoff of the H$_2$ gas from the H$_2$ gas source 64a into the processing container 1 are performed by the opening/closing of the valve 64e. Although the gases are supplied to the gas supply lines 66b and 68b at a relatively large flow rate by the storage tanks 66d and 68d, respectively, the gases supplied to the gas supply lines 66b and 68b are prevented from flowing backward to the H$_2$ supply line 64b by the orifice 64f.

The H$_2$ gas source 68a supplies an H$_2$ gas, which is a reducing gas, into the processing container 1 through a gas supply line 68b. The gas supply line 68b is provided with a flow rate controller 68c, a storage tank 68d, and a valve 68e from the upstream side. The downstream side of the valve 68e in the gas supply line 68b is connected to the gas supply line 64b. The H$_2$ gas supplied from the H$_2$ gas source 68a is temporarily stored in the storage tank 68d before being supplied into the processing container 1, so that the internal pressure of the storage tank 68d is increased to a predetermined pressure. Thereafter, the H$_2$ gas is supplied into the processing container 1. The supply and cutoff of the H$_2$ gas from the storage tank 68d into the processing container 1 are performed by the opening/closing of the valve 68e. By temporarily storing the H$_2$ gas in the storage tank 68d as described above, it is possible to stably supply the H$_2$ gas into the processing container 1 at a relatively large flow rate.

[Operation of Substrate Processing System]

Next, an example of the operation of the substrate processing system will be described.

First, the overall controller 600 controls the gate valve G31 to be opened, and controls the transfer mechanism 402 to transfer the wafer W accommodated in the carrier C on, for example, the load port 501, into the load-lock chamber 301. The overall controller 600 controls the gate valve G31 to be closed, and sets the interior of the load-lock chamber 301 to a vacuum atmosphere.

The overall controller 600 controls the gate valves G11 and G21 to be opened, and controls the transfer mechanism 201 to transfer the wafer W in the load-lock chamber 301 into the film forming apparatus 101. The overall controller 600 controls the gate valves G11 and G21, and operates the film forming apparatus 101. In this way, a process of forming an AlN film on the wafer W is performed in the film forming apparatus 101.

Subsequently, the overall controller 600 controls the gate valves G11 and G12 to be opened, and controls the transfer mechanism 201 to transfer the wafer W which has been processed in the film forming apparatus 101 to the film forming apparatus 102. The overall controller 600 controls the gate valves G11 and G12 to be closed, and operates the film forming apparatus 102. Therefore, a process of forming an initial tungsten film on the AlN film is performed in the film forming apparatus 102.

Subsequently, the overall controller 600 controls the gate valves G12 and G13 to be opened, and controls the transfer mechanism 201 to transfer the wafer W which has been processed in the film forming apparatus 102 into the film forming apparatus 103. The overall controller 600 controls the gate valves G12 and G13 to be closed, and operates the film forming apparatus 103. Therefore, a process of forming a main tungsten film on the initial tungsten film is performed in the film forming apparatus 103.

Subsequently, the overall controller 600 controls the transfer mechanism 201 to transfer the wafer W which has been processed in the film forming apparatus 103 to, for example, the load-lock chamber 303. The overall controller 600 sets the interior of the load-lock chamber 303 to an atmospheric environment. The overall controller 600 controls the gate valve G33 to be opened, and controls the transfer mechanism 402 to transfer the wafer W in the load-lock chamber 303 to, for example, the carrier C in the load port 503. The wafer W is accommodated in the respective carrier C.

As described above, according to the substrate processing system illustrated in FIG. 4, while the wafer W is being processed by the respective processing chambers, the wafer W can be subjected to predetermined process without being exposed to atmosphere, namely without breaking a vacuum state.

Hereinafter, the operations of the film forming apparatuses 101 to 103 (the step S10 of forming an Al-containing film, the step S20 of forming an initial tungsten film, and the step S30 of forming a main tungsten film) will be described in detail.

(Step S10 of Forming Al-Containing Film)

First, an example in the case in which an AlN film is formed as an Al-containing film will be described. First, in the state in which the valves 51e, 53e, 55e, and 57e are closed, the gate valve 12 is opened and the wafer W is transferred into the processing container 1 by the transfer mechanism. The wafer W is placed on the stage 2 located at the transfer position. The transfer mechanism is withdrawn from the interior of the processing container 1 and subsequently, the gate valve 12 is closed. The wafer W is heated to a predetermined temperature (e.g., 200 degrees C. to 550 degrees C.) by the heater 21 of the stage 2, and the stage 2 is moved up to the processing position to form the processing space 38. In addition, the interior of the processing container 1 is controlled to have a predetermined pressure (e.g., 100 Pa to 1,000 Pa) by the pressure control valve of the exhaust mechanism 42.

Subsequently, the valves 53e and 57e are opened to supply the carrier gas (the N$_2$ gas) of a predetermined flow rate (e.g., 1,000 sccm to 10,000 sccm) from the N$_2$ gas sources 53a and 57a to the gas supply lines 53b and 57b, respectively. In addition, the TMA gas is supplied from the Al-containing gas source 51a to the gas supply line 51b at a predetermined flow rate (e.g., 50 sccm to 500 sccm). In addition, the NH$_3$ gas is supplied from the reaction gas source 55a to the gas supply line 55b at a predetermined flow rate (e.g., 500 sccm to 10,000 sccm). At this time, since the valves 51e and 55e remain in the closed state, the TMA gas and the NH3 gas are stored in the storage tanks 51d and 55d, respectively, so that the internal pressure of each of the storage tanks 51d and 55d is increased.

Subsequently, the valve 51e is opened to supply the TMA gas stored in the storage tank 51d into the processing container 1. The TMA gas is adsorbed on the front surface of the wafer W.

After a predetermined period of time (e.g., 0.05 sec to 5 sec) since the valve 51e is opened, the valve 51e is closed to stop the supply of the TMA gas into the processing container 1. At this time, since the carrier gas is being supplied into the processing container 1, the TMA gas remaining in the processing container 1 is discharged toward the exhaust pipe 41. Thus, the interior of the processing container 1 is replaced from a TMA gas-based atmosphere to an atmosphere containing N$_2$ gas. Meanwhile, since the valve 51e remains in the closed state, the TMA gas supplied from the Al-containing gas source 51a to the gas supply line 51b is stored in the storage tank 51d, so that the internal pressure of the storage tank 51d is increased.

After a predetermined period of time (e.g., 0.05 sec to 5 sec) since the valve 51e is closed, the valve 55e is opened.

Thereby, the $NH_3$ gas stored in the storage tank 55d is supplied into the processing container 1 so that the TMA gas adsorbed onto the front surface of the wafer W is reduced.

After a predetermined period of time (e.g., 0.05 sec to 5 sec) since the valve 55e is opened, the valve 55e is closed to stop the supply of the $NH_3$ gas into the processing container 1. At this time, since the carrier gas is being supplied into the processing container 1, the $NH_3$ gas remaining in the processing container 1 is discharged toward the exhaust pipe 41, so that the interior of the processing container 1 is replaced from an $NH_3$ gas-based atmosphere to an $N_2$ gas-based atmosphere. Meanwhile, since the valve 55e remains in the closed state, the $NH_3$ gas supplied from the reaction gas source 55a to the gas supply line 55b is stored in the storage tank 55d, so that the internal pressure of the storage tank 55d is increased.

By performing the above cycle once, a thin AlN unit film is formed on the front surface of the TiN film. In addition, an AlN film having a desired film thickness is formed by repeating the above-described cycle plural times (e.g., 2 cycles to 30 cycles). Thereafter, the wafer W is unloaded from the processing container 1 in the reverse procedure to that at the time of loading the wafer W into the processing container 1.

Next, an example in the case in which an AlTiN film is formed as an Al-containing film will be described. The film forming apparatus 101A forms the AlTiN film by repeatedly supplying the Ti-containing gas, the Al-containing gas, and the reaction gas into the processing container 1. For example, the film forming apparatus 101A forms the AlTiN film by repeating a step of forming the TiN film and a step of forming the AlN film at least twice. The step of forming the TiN film may include forming the TiN film by repeating the alternate supply of the Ti-containing gas and the reaction gas at least once while performing a purge step between the supply of the Ti-containing gas and the supply of the reaction gas. The step of forming the AlN film forms may include forming the AlN film by repeating the alternate supply of the Al-containing gas and the reaction gas at least once while performing a purge step between the supply of the Al-containing gas and the supply of the reaction gas.

The controller 9 of the film forming apparatus 101A controls the heater 21 of the stage 2 to heat the wafer W to a predetermined temperature (e.g., 250 to 550 degrees C.). In addition, the controller 9 controls the pressure control valve of the exhaust mechanism 42 to adjust the internal pressure of the processing container 1 to a predetermined pressure (e.g., 0.1 to 10 Torr).

The controller 9 controls the valves 53e and 57e to be opened to supply the carrier gas ($N_2$ gas) of a predetermined flow rate from the $N_2$ gas sources 53a and 57a to the gas supply lines 53b and 57b, respectively. In addition, the controller 9 controls the $N_2$ gas sources 52a and Ma, the reaction gas source 55a, and the Ti-containing gas source 56a to supply the $N_2$ gas, the $NH_3$ gas and the $TiCl_4$ gas, to the gas supply lines 52b and 54b, the gas supply line 55b and the gas supply line 56b, respectively. At this time, since the valves 52e, Me, 55e, and 56e remain in the closed state, the $N_2$ gas, the $NH_3$ gas, and the $TiCl_4$ gas are stored in the storage tanks 52d and 54d, the storage tank 55d, and the storage tank 56d, respectively, so that the internal pressure of each of the storage tanks 52d, 54d, 55d, and 56d is increased.

The controller 9 controls the valve 56e to be opened to supply the $TiCl_4$ gas stored in the storage tank 56d into the processing container 1. A film formed by the $TiCl_4$ gas is adsorbed onto the front surface of the wafer W (step S11).

The $TiCl_4$ gas reacts in the pattern of $TiCl_4+NH_3 \rightarrow TiN+HCl\uparrow$, so that TiN is adsorbed onto the front surface of the wafer W.

After a predetermined period of time (e.g., 0.05 sec to 5 sec) since the valve 56e is opened, the controller 9 controls the valve 56e to be closed to stop the supply of the $TiCl_4$ gas into the processing container 1. In addition, the controller 9 controls the valves 52e and 54e to be opened to respectively supply the $N_2$ gases stored in the storage tanks 52d and 54d into the processing container 1 as purge gases (step S12). At this time, since the $N_2$ gases are supplied from the storage tanks 52d and 54d each having the increased internal pressure, the purge gases are supplied into the processing container 1 at a relatively large flow rate (e.g., a flow rate larger than that of the carrier gas). Therefore, the $TiCl_4$ gas remaining in the processing container 1 is quickly discharged toward the exhaust pipe 41, so that the interior of the processing container 1 is replaced from a Ti-containing gas-based atmosphere to an $N_2$ gas-based atmosphere in a short period of time. In addition, since the valve 56e remains in the closed state, the $TiCl_4$ gas supplied from the Ti-containing gas source 56a to the gas supply line 56b is stored in the storage tank 56d. Thus, the internal pressure of the storage tank 56d is increased. In addition, since the valve 56e remains in the closed state, the carrier gases ($N_2$ gases), which are being supplied from the gas supply line 53b and the gas supply line 57b, also function as purge gases. This makes it possible to exhaust excess $TiCl_4$ gas.

After a predetermined period of time (e.g., 0.05 sec to 5 sec) since the valves 52e and 54e are opened, the controller 9 controls the valves 52e and Me to be closed to stop the supply of the purge gases into the processing container 1. In addition, the controller 9 controls the valve 55e to be opened to supply the $NH_3$ gas stored in the storage tank 55d into the processing container 1. Thus, the $TiCl_4$ gas adsorbed onto the front surface of the wafer W is reduced (step S13).

After a predetermined period of time (e.g., 0.05 sec to 5 sec) since the valve 55e is opened, the controller 9 controls the valve 55e to be closed to stop the supply of the $NH_3$ gas into the processing container 1. In addition, the controller 9 controls the valves 52e and 54e to be opened to respectively supply the $N_2$ gases stored in the storage tanks 52d and 54d into the processing container 1 as purge gases (step S14). At this time, since the $N_2$ gases are supplied from the storage tanks 52d and 54d each having the increased internal pressure, the purge gases are supplied into the processing container 1 at a relatively large flow rate (e.g., a flow rate larger than that of the carrier gas). Therefore, the $NH_3$ gas remaining in the processing container 1 is quickly discharged toward the exhaust pipe 41, so that the interior of the processing container 1 is replaced from the $NH_3$ gas-based atmosphere to the $N_2$ gas-based atmosphere in a short period of time. In addition, since the valve 55e remains in the closed state, the $NH_3$ gas supplied from the reaction gas source 55a to the gas supply line 55b is stored in the storage tank 55d, so that the internal pressure of the storage tank 55d is increased. In addition, since the valve 55e remains in the closed state, the carrier gases ($N_2$ gases), which are being supplied from the gas supply line 53b and the gas supply line 57b, also function as purge gases. This makes it possible to exhaust excess $NH_3$ gases.

A cycle A including steps S11 to S14 corresponds to the process of forming a TiN film.

The controller 9 controls the valves 53e and 57e to be opened to supply the carrier gas ($N_2$ gas) of a predetermined flow rate from the $N_2$ gas sources 53a and 57a to the gas supply lines 53b and 57b, respectively. In addition, the controller 9 performs the control of stopping the supply of the TiCl$_4$ gas from the Ti-containing gas source 56a. In addition, the controller 9 performs the control of supplying the TMA gas, the N$_2$ gas, and the NH$_3$ gas from the Al-containing gas source 51a, the N$_2$ gas sources 52a and 54a, and the reaction gas source 55a to the gas supply lines 51b, 52b, 54b and 55b, respectively. At this time, since the valves 51e, 52e, 54e, and 55e remain in the closed state, the TMA gas, the N$_2$ gas, and the NH$_3$ gas are stored in the storage tanks 51d, 52d, 54d, and 55d, respectively. Thus, the internal pressure of each of the storage tanks 51d, 55d, 54d, and 56d is increased.

The controller 9 controls the valve 51e to be opened to supply the TMA gas stored in the storage tank 51d into the processing container 1. As a result, a film formed by the TMA gas is adsorbed onto the front surface of the wafer W (step S15). The TMA gas is reacted in the pattern of C$_6$H$_{18}$Al$_2$+NH$_3$→AlN+C$_x$H$_y$↑, so that the AlN film is adsorbed onto the front surface of the wafer W.

After a predetermined period of time (e.g., 0.05 sec to 5 sec) since the valve 51e is opened, the controller 9 controls the valve 51e to be closed to stop the supply of the TMA gas into the processing container 1. In addition, the controller 9 controls the valves 52e and 54e to be opened to supply the N$_2$ gas stored in each of the storage tanks 52d and 54d into the processing container 1 as a purge gas (step S16). At this time, since the N$_2$ gas is supplied from each of the storage tanks 52d and 54d having the increased internal pressure, the purge gas is supplied into the processing container 1 at a relatively large flow rate (e.g., a flow rate larger than that of the carrier gas). Therefore, the TMA gas remaining in the processing container 1 is quickly discharged toward the exhaust pipe 41, so that the interior of the processing container 1 is replaced from the TMA-based atmosphere to the N$_2$ gas-based atmosphere in a short period of time. In addition, since the valve 51e remains in the closed state, the TMA gas supplied from the Al-containing gas source 51a to the gas supply line 51b is stored in the storage tank 51d, so that the internal pressure of the storage tank 51d is increased. In addition, since the valve 51e remains in the closed state, the carrier gas (N$_2$), which is being supplied from each of the gas supply line 53b and the gas supply line 57b, also functions as a purge gas. This makes it possible to exhaust excess TMA gases.

After a predetermined period of time (e.g., 0.05 sec to 5 sec) since the valves 52e and 54e are opened, the controller 9 controls the valves 52e and 54e to be closed to stop the supply of the purge gas into the processing container 1. In addition, the controller 9 controls the valve 55e to be opened to supply the NH$_3$ gas stored in the storage tank 55d into the processing container 1 and reduce the TMA gas adsorbed onto the front surface of the wafer W (step S17).

After a predetermined period of time (e.g., 0.05 sec to 5 sec) since the valve 55e is opened, the controller 9 controls the valve 55e to be closed to stop the supply of the NH$_3$ gas into the processing container 1. In addition, the controller 9 controls the valves 52e and 54e to be opened to supply the N$_2$ gas stored in each of the storage tanks 52d and 54d into the processing container 1 as a purge gas (step S18). At this time, since the N$_2$ gas is supplied from each of the storage tanks 52d and 54d having the increased internal pressure, the purge gas is supplied into the processing container 1 at a relatively large flow rate (e.g., a flow rate larger than that of the carrier gas). Therefore, the NH$_3$ gas remaining in the processing container 1 is quickly discharged toward the exhaust pipe 41, so that the interior of the processing container 1 is replaced from the NH$_3$ gas-based atmosphere to the N$_2$ gas-based atmosphere in a short period of time. Since the valve 55e remains in the closed state, the NH$_3$ gas supplied from the reaction gas source 55a to the gas supply line 55b is stored in the storage tank 55d, so that the internal pressure of the storage tank 55d is increased. In addition, since the valve 55e remains in the closed state, the carrier gas (N$_2$), which is being supplied from each of the gas supply line 53b and the gas supply line 57b, also functions as a purge gas. This makes it possible to exhaust excess NH$_3$ gases.

A cycle B including steps S15 to S18 described above corresponds to the process of forming an AlN film.

The controller 9 performs the control of forming the AlTiN film having a desired film thickness by repeating the cycle of steps S11 to S18 multiple times.

The gas supply sequence and the conditions of process gases, which are used when forming the AlTiN film, are merely examples, and are not limited thereto. Other gas supply sequences and process conditions of process gases may be used to form the AlTiN film.

In the above-described gas supply sequence, the TiN film is formed by the cycle A of steps S11 to S14, and the AlN film is formed by the cycle B of steps S15 to S18. Therefore, by changing the number of execution times of the cycle A and the cycle B in the formation of the AlTiN film, it is possible to control content ratios of Ti and Al in the AlTiN film.

(Step S20 of Forming Initial Tungsten Film)

First, in the state in which the valves 61e to 63e and 65e to 67e are closed, the gate valve 12 is opened to transfer the wafer W into the processing container 1 by the transfer mechanism. The wafer W is placed on the stage 2 located at the transfer position. The transfer mechanism is withdrawn from the interior of the processing container 1, and the gate valve 12 is closed. The wafer W is heated to a predetermined temperature (e.g., 150 degrees C. to 300 degrees C.) by the heater 21 of the stage 2. The stage 2 is moved up to the processing position to form the processing space 38. In addition, the internal pressure of the processing container 1 is adjusted to a predetermined pressure (e.g., 100 Pa to 1,000 Pa) by the pressure control valve of the exhaust mechanism 42.

Subsequently, the valves 63e and 67e are opened to supply the carrier gas (N$_2$ gas) of a predetermined flow rate (e.g., 1,000 sccm to 10,000 sccm) from the N$_2$ gas sources 63a and 67a to the gas supply lines 63b and 67b, respectively. In addition, the WF$_6$ gas is supplied from the WF$_6$ gas source 61a to the gas supply line 61b at a predetermined flow rate (e.g., 50 sccm to 700 sccm). In addition, the B$_2$H$_6$ gas is supplied from the B$_2$H$_6$ gas source 65a to the gas supply line 65b at a predetermined flow rate (e.g., 100 sccm to 5,000 sccm). At this time, since the valves 61e and 65e remain in the closed state, the WF$_6$ gas and the B$_2$H$_6$ gas are stored in the storage tanks 61d and 65d, respectively, so that the internal pressure of each of the storage tanks 61d and 65d is increased.

Subsequently, the valve 61e is opened to supply the WF$_6$ gas stored in the storage tank 61d into the processing container 1. The WF$_6$ gas is adsorbed onto the front surface of the wafer W. In addition, in parallel with the supply of the WF$_6$ gas into the processing container 1, the purge gas (N$_2$ gas) is supplied from the N$_2$ gas sources 62a and 66a to the gas supply lines 62b and 66b, respectively. At this time, since the valves 62e and 66e remain in the closed state, the purge gas is stored in each of the storage tanks 62d and 66d, so that the internal pressure of each of the storage tanks 62d and 66d is increased.

After a predetermined period of time (e.g., 0.05 sec to 5 sec) since the valve 61e is opened, the valve 61e is closed and the valves 62e and 66e are opened. Therefore, the supply of the $WF_6$ gas into the processing container 1 is stopped, and the purge gas stored in each of the storage tanks 62d and 66d is supplied into the processing container 1. At this time, since the purge gas is supplied from each of the storage tanks 62d and 66d having the increased internal pressure, the purge gas is supplied into the processing container 1 at a relatively large flow rate, for example, a flow rate (e.g., 2,000 sccm to 20,000 sccm) larger than that of the carrier gas. Therefore, the $WF_6$ gas remaining in the processing container 1 is quickly discharged toward the exhaust pipe 41, so that the interior of the processing container 1 is replaced from the $WF_6$ gas-based atmosphere to the atmosphere containing the $N_2$ gas in a short period of time. Meanwhile, since the valve 61e remains in the closed state, the $WF_6$ gas supplied from the $WF_6$ gas source 61a to the gas supply line 61b is stored in the storage tank 61d, so that the internal pressure of the storage tank 61d is increased.

After a predetermined period of time (e.g., 0.05 sec to 5 sec) since the valves 62e and 66e are opened, the valves 62e and 66e are closed and the valve 65e is opened. Therefore, the supply of the purge gas into the processing container 1 is stopped, the $B_2H_6$ gas stored in the storage tank 65d is supplied into the processing container 1. Thus, the $WF_6$ gas adsorbed onto the front surface of the wafer W is reduced. At this time, since the valves 62e and 66e remain in the closed state, the purge gases supplied from the $N_2$ gas sources 62a and 66a to the gas supply lines 62b and 66b are stored in the storage tanks 62d and 66d, respectively, so that the internal pressure of each of the storage tanks 62d and 66d is increased.

After a predetermined period of time (e.g., 0.05 sec to 5 sec) since the valve 65e is opened, the valve 65e is closed and the valves 62e and 66e are opened. Therefore, the supply of the $B_2H_6$ gas into the processing container 1 is stopped, and the purge gas stored in each of the storage tanks 62d and 66d is supplied into the processing container 1. At this time, since the purge gas is supplied from each of the storage tanks 62d and 66d having the increased internal pressure, the purge gas is supplied into the processing container 1 at a relatively large flow rate, for example, a flow rate (e.g., 2,000 sccm to 20,000 sccm) larger than that of the carrier gas. Therefore, the $B_2H_6$ gas remaining in the processing container 1 is quickly discharged toward the exhaust pipe 41, so that the interior of the processing container 1 is replaced from the $B_2H_6$ gas-based atmosphere to the $N_2$ gas-based atmosphere in a short period of time. Meanwhile, since the valve 65e remains in the closed state, the $B_2H_6$ gas supplied from the $B_2H_6$ gas source 65a to the gas supply line 65b is stored in the storage tank 65d, so that the internal pressure of the storage tank 65d is increased.

By performing the above cycle once, a thin tungsten unit film is formed on the front surface of the AlN film. In addition, an initial tungsten film having a desired film thickness is formed by repeating the above-described cycle plural times (e.g., 2 cycles to 30 cycles). Thereafter, the wafer W is unloaded from the processing container 1 in the reverse procedure to that at the time of loading the wafer W into the processing container 1.

(Step S30 of Forming Main Tungsten Film)

First, in the state in which the valves 61e to 64e, and 66e to 68e are closed, the gate valve 12 is opened to transfer the wafer W into a processing container 1 by the transfer mechanism. The wafer W is placed on the stage 2 located at the transfer position. The transfer mechanism is withdrawn from the interior of the processing container 1, and the gate valve 12 is closed. The wafer W is heated to a predetermined temperature (e.g., 300 degrees C. to 600 degrees C.) by the heater 21 of the stage 2. The stage 2 is moved up to the processing position to form the processing space 38. In addition, the internal pressure of the processing container 1 is adjusted to a predetermined pressure (e.g., 100 Pa to 1,000 Pa) by the pressure control valve of the exhaust mechanism 42.

Subsequently, the valves 63e and 67e are opened to supply the carrier gas ($N_2$ gas) of a predetermined flow rate (e.g., 1,000 sccm to 10,000 sccm) from the $N_2$ gas sources 63a and 67a to the gas supply lines 63b and 67b, respectively. In addition, the valve 64e is opened to supply the $H_2$ gas of a predetermined flow rate (e.g., 500 sccm to 20,000 sccm) from the $H_2$ gas source 64a to the gas supply line 64b. In addition, the $WF_6$ gas and the $H_2$ gas are supplied from the $WF_6$ gas source 61a and the $H_2$ gas source 68a to the gas supply lines 61b and 68b, respectively. At this time, since the valves 61e and 68e remain in the closed state, the WF6 gas and the $H_2$ are stored in the storage tanks 61d and 68d, respectively, so that the internal pressure of each of the storage tanks 61d and 68d is increased.

Subsequently, the valve 61e is opened to supply the $WF_6$ gas stored in the storage tank 61d into the processing container 1. The $WF_6$ gas is adsorbed onto the front surface of the wafer W. In addition, in parallel with the supply of the $WF_6$ gas into the processing container 1, the purge gases ($N_2$ gases) are supplied from the $N_2$ gas sources 62a and 66a to the gas supply lines 62b and 66b, respectively. At this time, since the valves 62e and 66e remain in the closed state, the purge gases are stored in the storage tanks 62d and 66d, so that the internal pressure of each of the storage tanks 62d and 66d is increased.

After a predetermined period of time (e.g., 0.05 sec to 5 sec) since the valve 61e is opened, the valve 61e is closed and the valves 62e and 66e are opened. Therefore, the supply of the $WF_6$ gas into the processing container 1 is stopped, and the purge gas stored in each of the storage tanks 62d and 66d is supplied into the processing container 1. At this time, since the purge gas is supplied from each of the storage tanks 62d and 66d having the increased internal pressure, the purge gas is supplied into the processing container 1 at a relatively large flow rate, for example, a flow rate (e.g., 2,000 sccm to 20,000 sccm) larger than that of the carrier gas. Therefore, the $WF_6$ gas remaining in the processing container 1 is quickly discharged toward the exhaust pipe 41, so that the interior of the processing container 1 is replaced from the $WF_6$ gas-based atmosphere to an atmosphere containing the $H_2$ gas and the $N_2$ gas in a short period of time. Meanwhile, since the valve 61e remains in the closed state, the $WF_6$ gas supplied from the $WF_6$ gas source 61a to the gas supply line 61b is stored in the storage tank 61d, so that the internal pressure of the storage tank 61d is increased.

After a predetermined period of time (e.g., 0.05 sec to 5 sec) since the valves 62e and 66e are opened, the valves 62e and 66e are closed and the valve 68e is opened. Therefore, the supply of the purge gas into the processing container 1 is stopped, the $H_2$ gas stored in the storage tank 68d is supplied into the processing container 1. Thus, the $WF_6$ gas adsorbed onto the front surface of the wafer W is reduced. At this time, since the valves 62e and 66e remain in the closed state, the purge gases respectively supplied from the $N_2$ gas sources 62a and 66a to the gas supply lines 62b and 66b are stored in the storage tanks 62d and 66d, so that the internal pressure of each of the storage tanks 62d and 66d is increased.

After a predetermined period of time (e.g., 0.05 sec to 5 sec) since the valve 68e is opened, the valve 68e is closed and the valves 62e and 66e are opened. Therefore, the supply of the $H_2$ gas into the processing container 1 is stopped, and the purge gas stored in each of the storage tanks 62d and 66d is supplied into the processing container 1. At this time, since the purge gas is supplied from each of the storage tanks 62d and 66d having the increased internal pressure, the purge gas is supplied into the processing container 1 at a relatively large flow rate, for example, a flow rate (e.g., 2,000 sccm to 20,000 sccm) larger than that of the carrier gas. Therefore, the $H_2$ gas remaining in the processing container 1 is quickly discharged toward the exhaust pipe 41, so that the interior of the processing container 1 is replaced from the $H_2$ gas-based atmosphere to an atmosphere containing the $H_2$ gas and the $N_2$ gas in a short period of time. Meanwhile, since the valve 68e remains in the closed state, the $H_2$ gas supplied from the $H_2$ gas source 68a to the gas supply line 68b is stored in the storage tank 68d, so that the internal pressure of the storage tank 68d is increased.

By performing the above cycle once, a thin tungsten unit film is formed on the front surface of the initial tungsten film. In addition, a main tungsten film having a desired film thickness is formed by repeating the above-described cycle plural times (e.g., 2 cycles to 3,000 cycles). Thereafter, the wafer W is unloaded from the processing container 1 in the reverse procedure to that at the time of loading the wafer W into the processing container 1.

Example 1

Next, Example 1 in which the effects obtained from the film forming method of the embodiment were confirmed using the substrate processing system described with reference to FIGS. 4 to 8 will be described.

Table 1 below shows conditions for producing samples produced in Example 1.

TABLE 1

|  | Sample A | Sample B | Sample C | Sample D | Sample E |
|---|---|---|---|---|---|
| Reducing Gas | $B_2H_6$ | $B_2H_6$ | $SiH_4$ | $SiH_4$ | $B_2H_6$ |
| In-situ/Ex-situ | In-situ | Ex-situ | In-situ | Ex-situ | In-situ |
| Al-Containing Film | Presence | Presence | Presence | Presence | Absence |

Sample A is an initial tungsten film having a film thickness of 3 nm that was formed by forming an AlN film on a TiN film serving as a base, and subsequently, alternately supplying the $B_2H_6$ gas and the $WF_6$ gas in a repetitive manner in a depressurized state without exposing the AlN film to atmosphere while performing a purge process between the supply of the $B_2H_6$ gas and the supply of the $WF_6$ gas. Subsequently, a main tungsten film having a film thickness of 5 nm to 30 nm was formed by alternately supplying the $WF_6$ gas and the $H_2$ gas in a repetitive manner in a depressurized state without exposing the initial tungsten film to atmosphere while performing the purge process between the supply of the $WF_6$ gas and the supply of the $H_2$ gas.

Sample B is an initial tungsten film having a film thickness of 3 nm that was formed by forming an AlN film on a TiN film serving as a base, exposing the AlN film to atmosphere, and then alternately supplying the $B_2H_6$ gas and the $WF_6$ gas in a repetitive manner in a depressurized state while performing the purge process between the supply of the $B_2H_6$ gas and the supply of the $WF_6$ gas. Subsequently, a main tungsten film having a film thickness of 5 nm to 30 nm was formed by alternately supplying the $WF_6$ gas and the $H_2$ gas in a repetitive manner in a depressurized state without exposing the initial tungsten film to atmosphere while performing the purge process between the supply of the $WF_6$ gas and the supply of the $H_2$ gas.

Sample C is an initial tungsten film having a film thickness of 3 nm that was formed by forming an AlN film on a TiN film serving as a base, and then alternately supplying the $SiH_4$ gas and the $WF_6$ gas in a repetitive manner in a depressurized state without exposing the AlN film to atmosphere while performing the purge process between the supply of the $SiH_4$ gas and the $WF_6$ gas. Subsequently, a main tungsten film having a film thickness of 5 nm to 30 nm was formed by alternately supplying the $WF_6$ gas and the $H_2$ gas in a repetitive manner in a depressurized state without exposing the initial tungsten film to atmosphere while performing the purge process between the supply of the $WF_6$ gas and the supply of the $H_2$ gas.

Sample D is an initial tungsten film having a film thickness of 3 nm that was formed by forming an AlN film on a TiN film serving as a base, exposing the AlN film to atmosphere, and then alternately supplying the $SiH_4$ gas and the $WF_6$ gas in a repetitive manner in a depressurized state while performing the purge process between the supply of the $SiH_4$ gas and the supply of the $WF_6$ gas. Subsequently, a main tungsten film having a film thickness of 5 nm to 30 nm was formed by alternately supplying the $WF_6$ gas and the $H_2$ gas in a repetitive manner in a depressurized state without exposing the initial tungsten film to atmosphere while performing the purge process between the supply of the $WF_6$ gas and the supply of the $H_2$ gas.

In Sample E, an AlN film was not formed on a TiN film serving as a base. An initial tungsten film having a film thickness of 3 nm was formed by alternately supplying the $B_2H_6$ gas and the $WF_6$ gas in a repetitive manner in a depressurized state while performing a purge process between the supply of the $B_2H_6$ gas and the supply of the $WF_6$ gas. Subsequently, a main tungsten film having a film thickness of 5 nm to 30 nm was formed by alternately supplying the $WF_6$ gas and the $H_2$ gas in a repetitive manner in a depressurized state without exposing the initial tungsten film to atmosphere while performing the purge process between the supply of the $WF_6$ gas and the supply of the $H_2$ gas.

Figure 9:
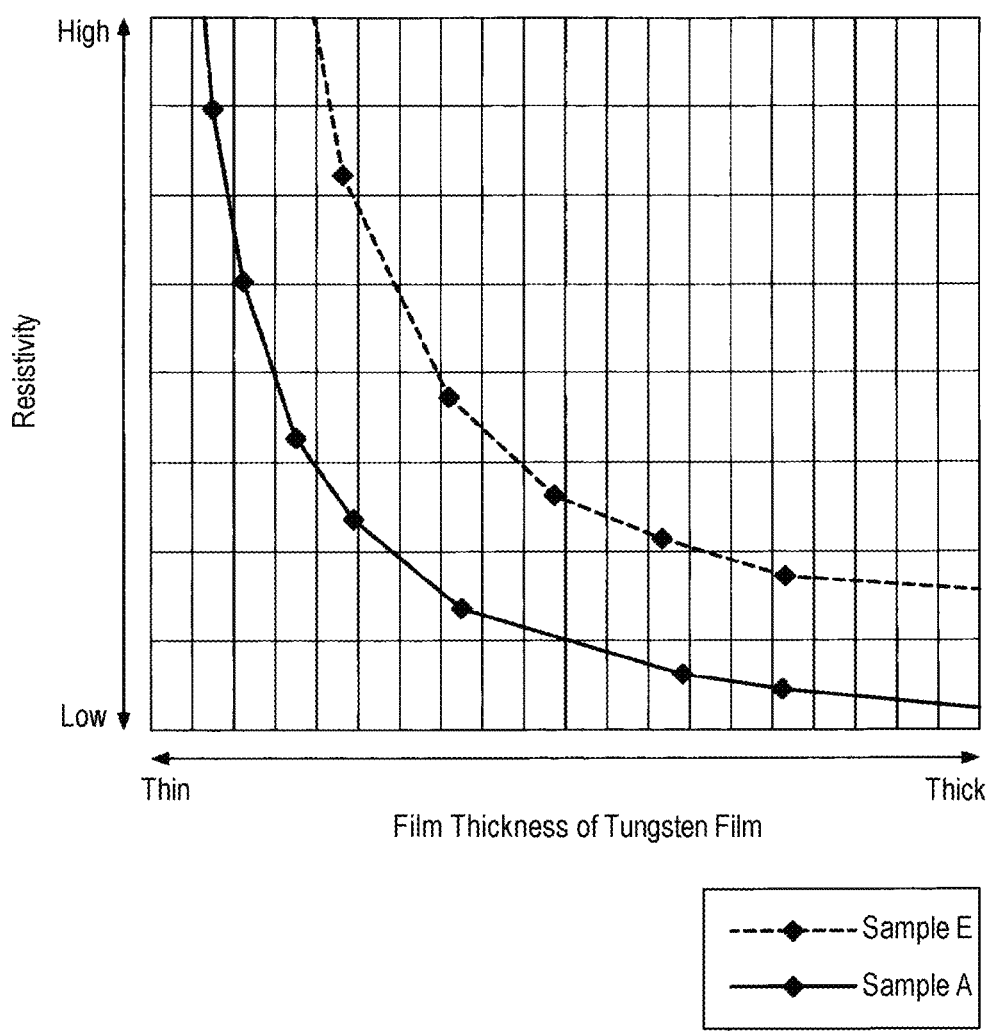
FIG. 9 is a view representing the evaluation results of a relationship between a film thicknesses and a resistivity of a main tungsten film.

Next, for Samples A and E, relationships between the film thicknesses and the resistivity of the main tungsten films were measured. FIG. 9 is a view representing the evaluation results of the relationships between the film thicknesses and the resistivity of the main tungsten films. In FIG. 9, the film thicknesses and the resistivity of the main tungsten films are represented on the horizontal axis and the vertical axis, respectively. In FIG. 9, the result of Sample A is shown by a solid line, and the result of Sample E is shown by a broken line. As shown in FIG. 9, it can be seen that the resistivity were lowered in Sample A compared with those in Sample E. From the results, it can be said that it is possible to form a low-resistance tungsten film by forming the AlN-containing film on the TiN film, and subsequently, forming the initial tungsten film and the main tungsten film.

Next, for Samples A to D, the adhesion of tungsten films was evaluated by a method according to JIS K 5600-5-6 (a cross-cut method). FIG. 10 is a view showing the evaluation results of the adhesion of tungsten films, which shows the evaluation results of the presence or absence of peeling of the tungsten films in Samples A to D. As shown in FIG. 10, peeling was not observed in Sample A, but peeling was observed in Samples B to D. From these results, it can be said that it is possible to form a tungsten film with good adhesion by forming the AlN film, and subsequently, forming an initial tungsten film without exposing the AlN film to atmosphere by alternately supplying the $B_2H_6$ gas and the $WF_6$ gas in a repetitive manner in a depressurized state while performing the purge process between the supply of the $B_2H_6$ gas and the supply of the $WF_6$ gas.

Figure 11A:
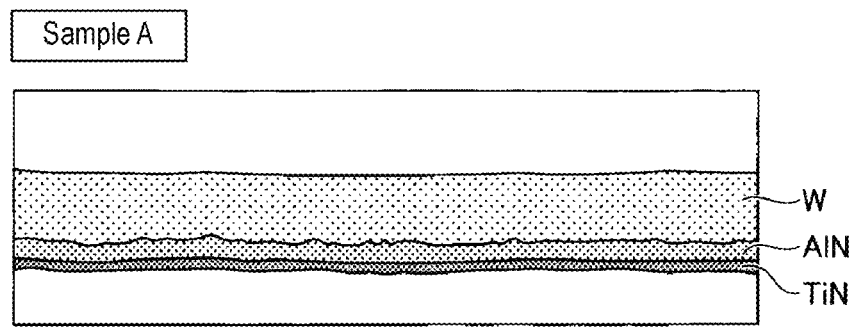
FIGS. 11A and 11B are views showing the evaluation results of surface roughness of tungsten films.
Figure 11B:
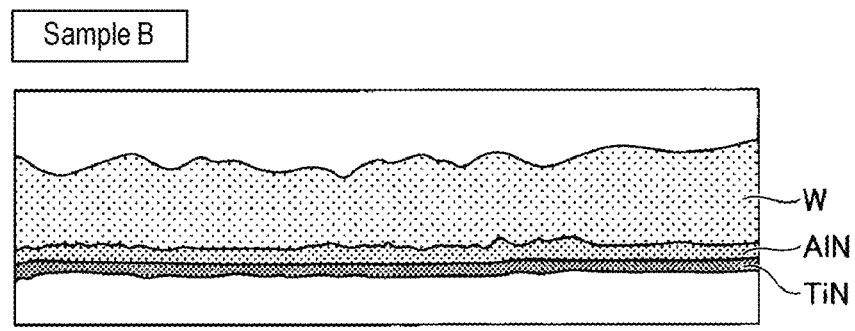

Next, for Samples A and B, the surface roughness of tungsten films was evaluated using a transmission electron microscope (TEM). FIGS. 11A and 11B are views showing the evaluation results of the surface roughness of tungsten films. FIGS. 11A and 11B are schematic views showing cross sections of Samples A and B when observed using the TEM, respectively. Each of the tungsten (W) films in FIGS. 11A and 11B is a stacked film of an initial tungsten film and a main tungsten film. As shown in FIGS. 11A and 11B, it can be seen that in Sample A, a tungsten film having a smooth surface is formed, whereas, in Sample B, a tungsten film having irregularities on the surface thereof is formed. From these results, it can be said that it is possible to form a tungsten film having a smooth surface by forming an AlN film, and subsequently, an initial tungsten film without exposing the AlN film to atmosphere.

Next, for Samples A and B, a difference in film composition was evaluated by X-ray photoelectron spectroscopy (XPS). FIG. 12 is a view showing the evaluation results of XPS, which shows O1s spectra obtained by measuring the surfaces of the main tungsten films of Samples A and B. In FIG. 12, the horizontal axis and the vertical axis represent the bonding energy [eV] and the intensity [a. u.], respectively, and the results of Samples A and B are shown by a solid line and a broken line, respectively. As shown in FIG. 12, it can be seen that the energy value of the peak of the O1s spectrum in Sample A is small compared with that in Sample B. From these results, it can be said that it is possible to suppress surface oxidation of an AlN film by forming the AlN film, and subsequently, forming an initial tungsten film by alternately supplying the $B_2H_6$ gas and the $WF_6$ gas in a repetitive manner in a depressurized state without exposing the AlN film to atmosphere while performing a purge process between the supply of the $B_2H_6$ gas and the supply of the $WF_6$ gas. In addition, it is considered from the results of FIGS. 11A and 11B and FIG. 12 that it is possible to form a tungsten film with good adhesion by suppressing the surface oxidation of the AlN film.

Example 2

Next, Example 2 in which the effects obtained from the film forming method of the embodiment were confirmed using the substrate processing system described with reference to FIGS. 4 to 8 will be described.

Sample F is an initial tungsten film having a film thickness of 1 nm to 4 nm that was formed by forming an AlTiN film on an AlO substrate serving as a base, and then alternately supplying the $B_2H_6$ gas and the $WF_6$ gas in a repetitive manner in a depressurized state without exposing the AlTiN film to atmosphere while performing a purge process between the supply of the $B_2H_6$ gas and the supply of the $WF_6$ gas. Subsequently, a main tungsten film having a film thickness of 7 nm to 14 nm was formed by alternately supplying the $WF_6$ gas and the $H_2$ gas in a repetitive manner in a depressurized state without exposing the initial tungsten film to atmosphere while performing a purge process between the supply of the $WF_6$ gas and the supply of the $H_2$ gas.

Sample G is an initial tungsten film having a film thickness of 1 nm to 4 nm that was formed by forming an AlTiN film on an AlO substrate serving as a base, exposing the AlTiN film to atmosphere, and then alternately supplying the $B_2H_6$ gas and the $WF_6$ gas in a repetitive manner in a depressurized state while performing a purge process between the supply of the $B_2H_6$ gas and the supply of the $WF_6$ gas. Subsequently, a main tungsten film having a film thickness of 7 nm to 14 nm was formed by alternately supplying the $WF_6$ gas and the $H_2$ gas in a repetitive manner in a depressurized state without exposing the initial tungsten film to atmosphere while performing a purge process between the supply of the $WF_6$ gas and the supply of the $H_2$ gas.

Next, for Samples F and G, relationships between the film thicknesses and the resistivity of initial tungsten films and main tungsten films were measured. FIGS. 13A and 13B are views, each representing the evaluation results of relationships between the film thicknesses and resistivity of tungsten films. FIG. 13A shows the evaluation result of Sample F, and FIG. 13B shows the evaluation result of Sample G. In FIGS. 13A and 13B, the film thicknesses and the resistivity of the main tungsten films are represented on the horizontal axis and the vertical axis, respectively. Further, in FIGS. 13A and 13B, the results obtained when the film thicknesses of the initial tungsten films were 1 nm, 2 nm, 3 nm, and 4 nm are shown by a solid line, a broken line, a dotted line, and a dashed one-dotted line, respectively. The scales in the horizontal axes and vertical axes of FIG. 13A and FIG. 13B are the same.

As shown in FIG. 13A, in Sample F, it can be seen that the resistivity hardly changes even if the film thicknesses of the initial tungsten films change. Meanwhile, as shown in FIG. 13B, in Sample G, it can be seen that the resistivity significantly changes even if the film thicknesses of the initial tungsten films change. More specifically, in Sample G, it can be seen that when the film thicknesses of the initial tungsten film are 2 nm and 3 nm, the resistivity is similar to those in Sample F, but the resistivity is significantly increased when the film thicknesses of the initial tungsten film are small (e.g., 1 nm) or large (e.g., 4 nm). From these results, it can be seen that a process margin in forming an initial tungsten film is expanded by forming an AlTiN film, and subsequently, forming the initial tungsten film on the front surface of the AlTiN film without exposing the AlTiN film to atmosphere. This improves the yield, thus reducing the manufacturing cost.

Next, for Sample F and Sample G, the adhesion of tungsten films was evaluated by the method according to JIS K 5600-5-6 (a cross-cut method). The film thickness of the initial tungsten film of each of Sample F and Sample G was 1.5 nm, and the film thickness of the main tungsten film was 18.5 nm. FIG. 14 is a view showing the evaluation results of the adhesion of tungsten films, which shows the evaluation results of the presence or absence of peeling of tungsten films in Sample F and Sample G. As shown in FIG. 14, peeling was not observed in Sample F, but peeling was observed in Sample G. From these results, it can be said that it is possible to form a tungsten film with good adhesion by forming an AlTiN film, and subsequently, forming an initial tungsten film on the front surface of the AlTiN film without exposing the AlTiN film to atmosphere.

Figure 15A:
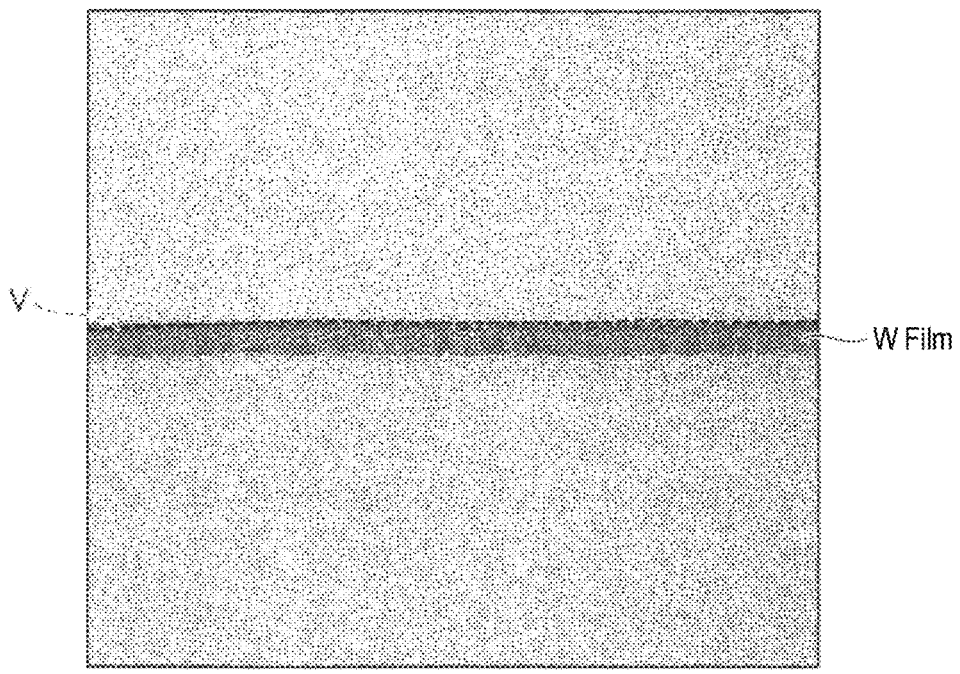
FIGS. 15A and 15B are views showing the evaluation results of surface roughness of tungsten films.
Figure 15B:
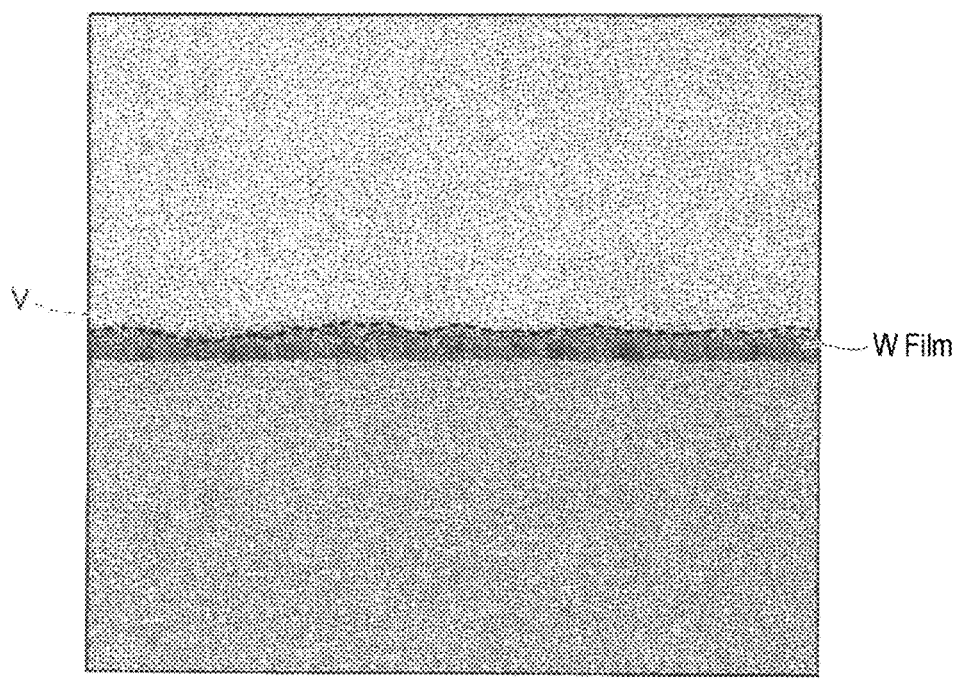

Next, for Sample F and Sample G, the surface roughness of the tungsten films was evaluated using TEM. FIGS. 15A and 15B are views showing the evaluation results of the surface roughness of tungsten films. FIGS. 15A and 15B are schematic views showing cross sections of Sample F and Sample G when observed using TEM, respectively. In FIGS. 15A and 15B, a phantom line V (broken line) is drawn to a surface of each tungsten film for easily understanding the states of surfaces of tungsten (W) films. Each of the tungsten (W) films in FIGS. 15A and 15B is a stacked film of an initial tungsten film and a main tungsten film. It can be seen that, in Sample F, a tungsten film having a smooth surface is formed as shown in FIG. 15A, whereas, in Sample G, a tungsten film having irregularities on the surface thereof is formed, as shown in FIG. 15B. From these results, it can be said that it is possible to form a tungsten film having a smooth surface by forming an AlTiN film, and subsequently, forming an initial tungsten film without exposing the AlTiN film to atmosphere.

It should be noted that the embodiments disclosed herein are exemplary in all respects and are not restrictive. The above-described embodiments may be omitted, replaced or modified in various forms without departing from the scope and spirit of the appended claims.

In the above embodiment, a semiconductor wafer is described as an example of the substrate, but the semiconductor wafer may be a silicon wafer, or a compound semiconductor wafer such as GaAs, SiC, GaN, or the like. Furthermore, the substrate is not limited to the semiconductor wafer, and may be a glass substrate used for a flat panel display (FPD) such as a liquid crystal display device, a ceramic substrate, or the like.

In the above embodiment, the case of using the $N_2$ gas as a purge gas and a carrier gas in the step S20 of forming an initial tungsten film and the step S30 of forming a main tungsten film has been described, but the present disclosure is not limited thereto. For example, an argon (Ar) gas may be used instead of the $N_2$ gas for either or both of the purge gas and the carrier gas.

According to the present disclosure, it is possible to form a low-resistance tungsten film with good adhesion.

What is claimed is:

1. A film forming method comprising:
  forming an Al-containing film on a base in a depressurized state; and
  subsequently, forming an initial tungsten film on the Al-containing film by alternately supplying a $B_2H_6$ gas and a $WF_6$ gas in a repetitive manner in the depressurized state without exposing the Al-containing film to an atmosphere while performing a purge process between the supply of the $B_2H_6$ gas and the supply of the $WF_6$ gas.

2. The film forming method of claim 1, further comprising:
  forming a main tungsten film on the initial tungsten film by alternately supplying a tungsten-containing gas and a reducing gas for reducing the tungsten-containing gas in a repetitive manner in the depressurized state while performing the purge process between the supply of the tungsten-containing gas and the supply of the reducing gas, the forming the main tungsten film occurring after the forming the initial tungsten film.

3. The film forming method of claim 1, wherein the forming the Al-containing film comprises alternately supplying an Al-containing gas and a nitrogen-containing gas in a repetitive manner in the depressurized state while performing the purge process between the supply of the Al-containing gas and the supply of the nitrogen-containing gas.

4. The film forming method of claim 3, wherein the Al-containing gas is a TMA gas, and the nitrogen-containing gas is an $NH_3$ gas.

5. The film forming method of claim 1, wherein the forming the Al-containing film and the forming the initial tungsten film are performed inside different processing containers which are connected to each other through a vacuum transfer chamber.

6. The film forming method of claim 1, wherein the forming the Al-containing film and the forming the initial tungsten film are performed inside the same processing container.

7. The film forming method of claim 1, wherein the base is a Ti-containing film.

8. The film forming method of claim 1, wherein the Al-containing film is an amorphous AlN film.

9. The film forming method of claim 1, wherein the base is a substrate, and the Al-containing film is an AlTiN film.

10. The film forming method of claim 2, wherein the tungsten-containing gas is a $WF_6$ gas, and the reducing gas is an $H_2$ gas.

11. A substrate processing system comprising:
  a vacuum transfer chamber including a transfer mechanism provided therein, the transfer mechanism being configured to transfer a substrate in a depressurized state;
  a first film forming apparatus connected to the vacuum transfer chamber;
  a second film forming apparatus connected to the vacuum transfer chamber; and
  a controller,
  wherein the controller is configured to control the vacuum transfer chamber, the first film forming apparatus, and the second film forming apparatus to execute a sequence of steps of:
  transferring the substrate into the first film forming apparatus and forming an Al-containing film on a base in a depressurized state inside the first film forming apparatus;
  transferring the substrate from the first film forming apparatus to the vacuum transfer chamber; and
  transferring the substrate from the vacuum transfer chamber to the second film forming apparatus and forming an initial tungsten film on the Al-containing film by alternately supplying a $B_2H_6$ gas and a $WF_6$ gas in a repetitive manner in the depressurized state without exposing the substrate to an atmosphere while performing a purge process between the supply of the $B_2H_6$ gas and the supply of the $WF_6$ gas.

* * * * *